US011251123B1

(12) United States Patent
Sharma et al.

(10) Patent No.: US 11,251,123 B1
(45) Date of Patent: Feb. 15, 2022

(54) STATIC RANDOM ACCESS MEMORY (SRAM) BIT CELLS EMPLOYING ASYMMETRIC WIDTH READ AND WRITE WORD LINES, AND RELATED METHODS

(71) Applicant: QUALCOMM Incorporated, San Diego, CA (US)

(72) Inventors: Sunil Sharma, Bangalore (IN); Rahul Biradar, Bangalore (IN); Sonia Ghosh, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/002,486

(22) Filed: Aug. 25, 2020

(51) Int. Cl.
*H01L 23/528* (2006.01)
*H01L 27/11* (2006.01)
*H01L 21/8238* (2006.01)
*H01L 21/768* (2006.01)
*H01L 23/522* (2006.01)

(52) U.S. Cl.
CPC .... *H01L 23/5283* (2013.01); *H01L 21/76816* (2013.01); *H01L 21/76877* (2013.01); *H01L 21/823871* (2013.01); *H01L 23/5226* (2013.01); *H01L 27/1104* (2013.01); *H01L 27/1116* (2013.01)

(58) Field of Classification Search
CPC ............ H01L 23/5283; H01L 23/5226; H01L 21/76816; H01L 21/76877; H01L 21/823871; H01L 27/1104; H01L 27/1116
USPC ........................................................ 257/369
See application file for complete search history.

(56) References Cited

U.S. PATENT DOCUMENTS

| 7,742,326 | B2 | 6/2010 | Houston |
| 7,839,697 | B2 | 11/2010 | Ishikura et al. |
| 10,128,253 | B2 | 11/2018 | Liaw |
| 10,354,952 | B2 | 7/2019 | Fujiwara et al. |
| 10,546,864 | B2 * | 1/2020 | Liaw ......................... G11C 8/16 |
| 2009/0161410 | A1 | 6/2009 | Houston |
| 2016/0064067 | A1 | 3/2016 | Mojumder et al. |

(Continued)

OTHER PUBLICATIONS

Allan, G. et al., "An Yield Improvement Technique for IC Layout Using Local Design Rules, " IEEE Transactions on Computer-Aided Design, vol. 11, No. 11, Nov. 1, 1992, IEEE, 8 pages.

(Continued)

*Primary Examiner* — Tu-Tu V Ho
(74) *Attorney, Agent, or Firm* — QUALCOMM Incorporated

(57) ABSTRACT

Static random access memory (SRAM) bit cells employing asymmetric width read and write word lines (WWL) for reduced memory write latency and improved memory write access performance, and related fabrication methods are disclosed. In exemplary aspects, the SRAM bit cell employs an increased width write word line based on a circuit cell layout area savings achieved by employing a reduced width read word line. Increasing the width of the write word line can reduce the resistance of the write word line and decrease memory write latency to the SRAM bit cell as a result. In certain exemplary aspects, the metal line pitch and minimum distance between metal lines of the SRAM bit cell can be maintained for maintaining fabrication compatibility with existing fabrication processes with decreasing the resistance of the write word line of the SRAM bit cell.

20 Claims, 13 Drawing Sheets

(56) References Cited

U.S. PATENT DOCUMENTS

2017/0271342 A1  9/2017  Fujiwara et al.

OTHER PUBLICATIONS

International Search Report and Written Opinion for International Patent Application No. PCT/US2021/040123, dated Oct. 22, 2021, 17 pages.

* cited by examiner

STATIC RANDOM ACCESS MEMORY (SRAM) BIT CELLS EMPLOYING ASYMMETRIC WIDTH READ AND WRITE WORD LINES, AND RELATED METHODS

BACKGROUND

I. Field of the Disclosure

The technology of the disclosure relates generally to memory for computer systems for reading and writing data, and particularly to memory employing static random access memory (SRAM) bit cells.

II. Background

Processor-based computer systems include memory for data storage. Different types of memory exist that each possessing certain unique features. For example, static random access memory (SRAM) is a type of memory that can be employed in processor-based computer systems. SRAM can store data without the need to periodically refresh the memory, unlike dynamic random access memory (DRAM) for example. An SRAM contains a plurality of SRAM bit cells (also referred to as "bit cells") organized in memory rows and columns in an SRAM array. For any given row in an SRAM array, each column of the SRAM array includes an SRAM bit cell in which a single data value or bit is stored. Memory read and write operations are performed on a particular SRAM bit cell using read and write word lines which correspond to the SRAM bit cell row that includes the particular SRAM bit cell.

FIG. 1 is a circuit diagram of a standard six (6) transistor (6-T) SRAM bit cell 100. The SRAM bit cell 100 comprises two (2) cross-coupled inverters 102(0), 102(1) powered by supply voltage $V_{DD}$. The cross-coupled inverters 102(0), 102(1) reinforce each other to retain data in the form of a voltage on a respective true storage node (T) 103T and a complement storage node (C) 103C. Each inverter 102(0), 102(1) is comprised of a respective pull-up P-type field-effect transistor (PFET) 104P(0), 104P(1) coupled in series to a respective pull-down N-type field-effect transistor (NFET) 104N(0), 104N(1). NFET access transistors 106(0), 106(1) are coupled to the respective cross-coupled inverters 102(0), 102(1) to provide respective combined read/write ports 108(0), 108(1) to the SRAM bit cell 100. In a read operation, a bitline BL and complement bitline BLB are both pre-charged to voltage based on the supply voltage $V_{DD}$. Then, a word line WL coupled to gates G(0), G(1) of the NFET access transistors 106(0), 106(1) is asserted to evaluate the differential voltages on the true storage node 103T and complement storage node 103C to read the SRAM bit cell 100. Assertion of the word line WL will cause either NFET access transistor 106(0) or 106(1) to discharge a pre-charged voltage on a respective bitline BL or complement bitline BLB depending on the storage state of the SRAM bit cell 100. In a write operation, the bitline BL and the complement bitline BLB are pre-charged to voltages representing different logic values with the voltage on the bitline BL representing the logic value to be written. Then, a word line WL coupled to gates G(0), G(1) of the NFET access transistors 106(0), 106(1) is asserted which causes voltages to be asserted to the true storage node 103T and complement node 103C based on the voltages pre-charged on the bitline BL and the complement bitline BLB.

SRAM bit cells, like the SRAM bit cell 100 in FIG. 1, are fabricated as part of a memory in a semiconductor wafer or die as complementary metal oxide semiconductor (CMOS) circuits. The SRAM bit cell is fabricated according to a pre-designed circuit layout according to a circuit cell design. The circuit layout prescribes the layout design for placement of PFETs, NFETs, and placement of metal lines that form interconnections between the PFETs, NFETs and the bitlines and word lines. The design and placement of the metal lines in an SRAM bit cell are not only important to provide the necessary connections for proper circuit operation, but are also important to accomplish the desired performance of the SRAM bit cell. For example, memory access times to the SRAM bit cell are affected by the resistance of current paths in the SRAM bit cell. The resistances of the current paths are affected by the length and volume of the metal lines forming the bitlines, word lines, and interconnections in the SRAM bit cell. For example, an increased resistance in the SRAM bit cell can result in increased memory access times due to the slower rise times of the word line.

SUMMARY OF THE DISCLOSURE

Aspects disclosed herein include static random access memory (SRAM) bit cells employing an asymmetric width read and write word lines. Related fabrication methods are also disclosed. SRAM bit cells employing asymmetric width read and write word lines can reduce memory write latency and improve memory write access performance. The SRAM bit cell can be provided in the form of a complementary metal oxide semiconductor (CMOS) circuit in a cell circuit according to a circuit cell design layout in an example. The routing area provided for the layout of the write word line and read word line in the circuit cell for the SRAM bit cell is based on the design rule constraints for the SRAM bit cell. In exemplary aspects disclosed herein, the SRAM bit cell employs an increased width write word line based on a circuit cell layout area savings achieved by employing a reduced width read word line. Increasing the width of the write word line can reduce the resistance of the write word line and decrease memory write latency to the SRAM bit cell as a result. In certain exemplary aspects, the metal line pitch and minimum distance between metal lines of the SRAM bit cell can be maintained for maintaining fabrication compatibility with existing fabrication processes with decreasing the resistance of the write word line of the SRAM bit cell. Decreasing the width of the read word line to allow an increased width write word line may not compromise read access latency sufficiently to affect the overall desired memory access latency of the SRAM bit cell in an intolerable manner. In some examples, the SRAM bit cell includes multiple read word lines having a smaller width than one or more write word lines based on the number of read and write ports provided for the SRAM bit cell.

In other exemplary aspects, the read word line of the SRAM bit cell is provided in a higher metal layer than the write word line in the SRAM bit cell in an integrated circuit (IC). The metal layer in which the write word line is disposed includes a read word line interconnect that is coupled to the read word line in the higher metal layer through one or more read word line interconnect vertical interconnect accesses (vias). The read word line interconnect via connected to the read word line interconnect is larger in at least one dimension (e.g., width) than a write word line via that interconnects the write word line to a lower metal layer and/or transistor of the SRAM bit cell. Increasing the size of the read word line interconnect via can mitigate any increased resistance that may be present in the read word line as a result of decreasing the width of the read word line interconnect. The read word line interconnect may be enlarged in width to accommodate a connection with the full area of the enlarged read word line interconnect via.

In another exemplary aspect, the width of the write word line via in the SRAM bit cell is at least 50% greater than the width of the read word line interconnect via.

In another exemplary aspect, the SRAM bit cell includes a second read word line interconnect in a metal layer between the metal layer containing the write word line and the metal layer containing the read word line. The second read word line interconnect is enlarged in width to a connection with the full area of the enlarged read word line interconnect via.

In another exemplary aspect, a ratio of the width of the write word line to the read word line interconnect in the same metal layer as the write word line is between 1.1 and 2.2.

In another exemplary aspect, the SRAM bit cell includes two (2) or more read ports separate from at least one write port. The read ports include two (2) or more respective read word line interconnects on the metal layer as the write word line. The read word line interconnects are discontinuous interconnects that are provided in the cell circuit of the SRAM bit cell.

In this regard, in one exemplary aspect, an IC is provided. The IC comprises a semiconductor layer. The semiconductor layer comprises an SRAM bit cell circuit comprising a storage node, a write access circuit coupled to the storage node, and a first read access circuit coupled to the storage node. The IC also comprises a first metal layer disposed above the semiconductor layer. The first metal layer comprises a write word line (WWL) coupled to the write access circuit, the WWL having a longitudinal axis extending in a first direction and having a width in a second direction orthogonal to the first direction. The first metal layer also comprises a first read word line (RWL) interconnect of a first RWL coupled to the first read access circuit, the first RWL interconnect having a longitudinal axis extending in the first direction and having a width in the second direction. The width of the WWL is greater than the width of the first RWL interconnect. The IC also comprises a second metal layer disposed above the first metal layer. The second metal layer comprises a second RWL interconnect of the first RWL having a longitudinal axis extending in the second direction. The second metal layer also comprises a first RWL interconnect via coupled to the first RWL interconnect and the second RWL interconnect, the first RWL interconnect via having a length in the first direction. The length of the first RWL interconnect via is greater than the width of the first RWL interconnect.

In another exemplary aspect, an IC is provided. The IC comprises a semiconductor layer. The semiconductor layer comprises an SRAM bit cell circuit comprising a storage node, a write access circuit coupled to the storage node, and a read access circuit coupled to the storage node. The IC also comprises a first metal layer disposed above the semiconductor layer. The first metal layer comprises a WWL coupled to the write access circuit, the WWL having a longitudinal axis extending in a first direction and having a width in a second direction orthogonal to the first direction. The first metal layer also comprises a first RWL interconnect of a first RWL coupled to the read access circuit. The first RWL interconnect has a longitudinal axis extending in the first direction and a width in the second direction. A ratio of the width of the WWL to the width of the first RWL interconnect is between 1.1-2.2.

In another exemplary aspect, an IC is provided. The IC comprises a semiconductor layer. The semiconductor layer comprises an SRAM bit cell circuit comprising a storage node, a write access circuit coupled to the storage node, and a read access circuit coupled to the storage node. The IC also comprises a first metal layer disposed above the semiconductor layer. The first metal layer comprises a WWL coupled to the write access circuit. The WWL has a longitudinal axis extending in a first direction and a width in a second direction orthogonal to the first direction. The first metal layer also comprises a first RWL interconnect of a first RWL coupled to the read access circuit. The first RWL interconnect has a longitudinal axis extending in the first direction and a width in the second direction. The width of the WWL is greater than the width of the first RWL interconnect. The IC also comprises a WWL via coupled to the WWL having a length in the first direction. The IC also comprises a second metal layer disposed above the first metal layer. The second metal layer comprises a second RWL interconnect of the first RWL having a longitudinal axis extending in the second direction. The IC also comprises a first RWL interconnect via coupled to the first RWL interconnect and the second RWL interconnect, the first RWL interconnect via having a length in the first direction. The length of the first RWL interconnect via is greater than the length of the WWL via.

In another exemplary aspect, a method of fabricating an IC is provided. The method comprises forming a semiconductor layer. The method also comprises forming a SRAM bit cell circuit in the semiconductor layer, wherein the SRAM bit cell circuit comprises a storage node, a write access circuit coupled to the storage node and a first read access circuit coupled to the storage node. The method also comprises forming a first metal layer above the semiconductor layer comprising forming a write word line (WWL) coupled to the write access circuit, the WWL having a longitudinal axis extending in a first direction and having a width in a second direction orthogonal to the first direction, and forming a first read word line (RWL) interconnect of a first RWL coupled to the first read access circuit, the first RWL interconnect having a longitudinal axis extending in the first direction and having a width in the second direction. The width of the WWL greater than the width of the first RWL interconnect.

DETAILED DESCRIPTION

Figure 1:
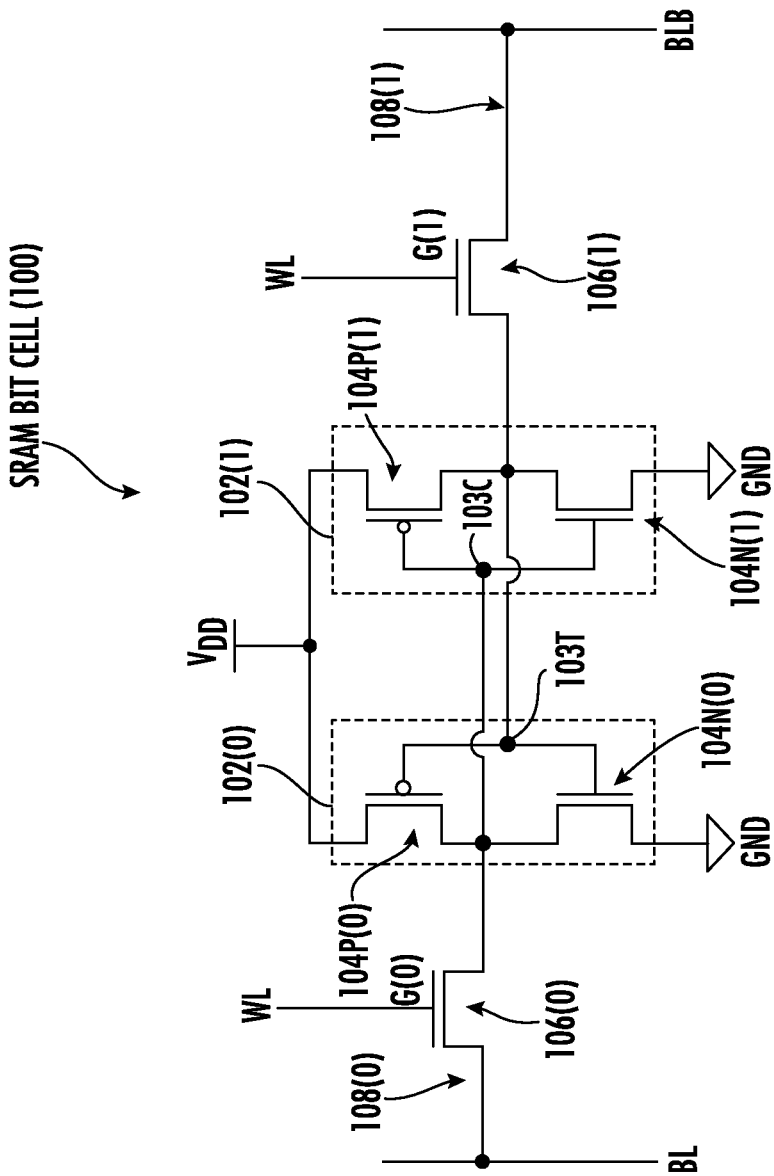
FIG. 1 is a circuit diagram of an exemplary six (6) transistor (6T) static random access memory (SRAM) bit cell circuit ("SRAM bit cell")

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include static random access memory (SRAM) bit cells employing an asymmetric width read and write word lines. Related fabrication methods are also disclosed. SRAM bit cells employing asymmetric width read and write word lines can reduce memory write latency and improve memory write access performance. The SRAM bit cell may be provided in the form of a complementary metal oxide semiconductor (CMOS) circuit in a cell circuit according to a circuit cell design layout in an example. The routing area provided for the layout of the write word line and read word line in the circuit cell for the SRAM bit cell is based on the design rule constraints for the SRAM bit cell. In exemplary aspects disclosed herein, the SRAM bit cell employs an increased width write word line based on a circuit cell layout area savings achieved by employing a reduced width read word line. Increasing the width of the write word line can reduce the resistance of the write word line and decrease memory write latency to the SRAM bit cell as a result. In certain exemplary aspects, the metal line pitch and minimum distance between metal lines of the SRAM bit cell can be maintained for maintaining fabrication compatibility with existing fabrication processes with decreasing the resistance of the write word line of the SRAM bit cell. Decreasing the width of the read word line to allow an increased width write word line may not compromise read access latency sufficiently to affect the overall desired memory access latency of the SRAM bit cell in an intolerable manner. In some examples, the SRAM bit cell includes multiple read word lines having a smaller width than one or more write word lines based on the number of read and write ports provided for the SRAM bit cell.

Figure 2A:
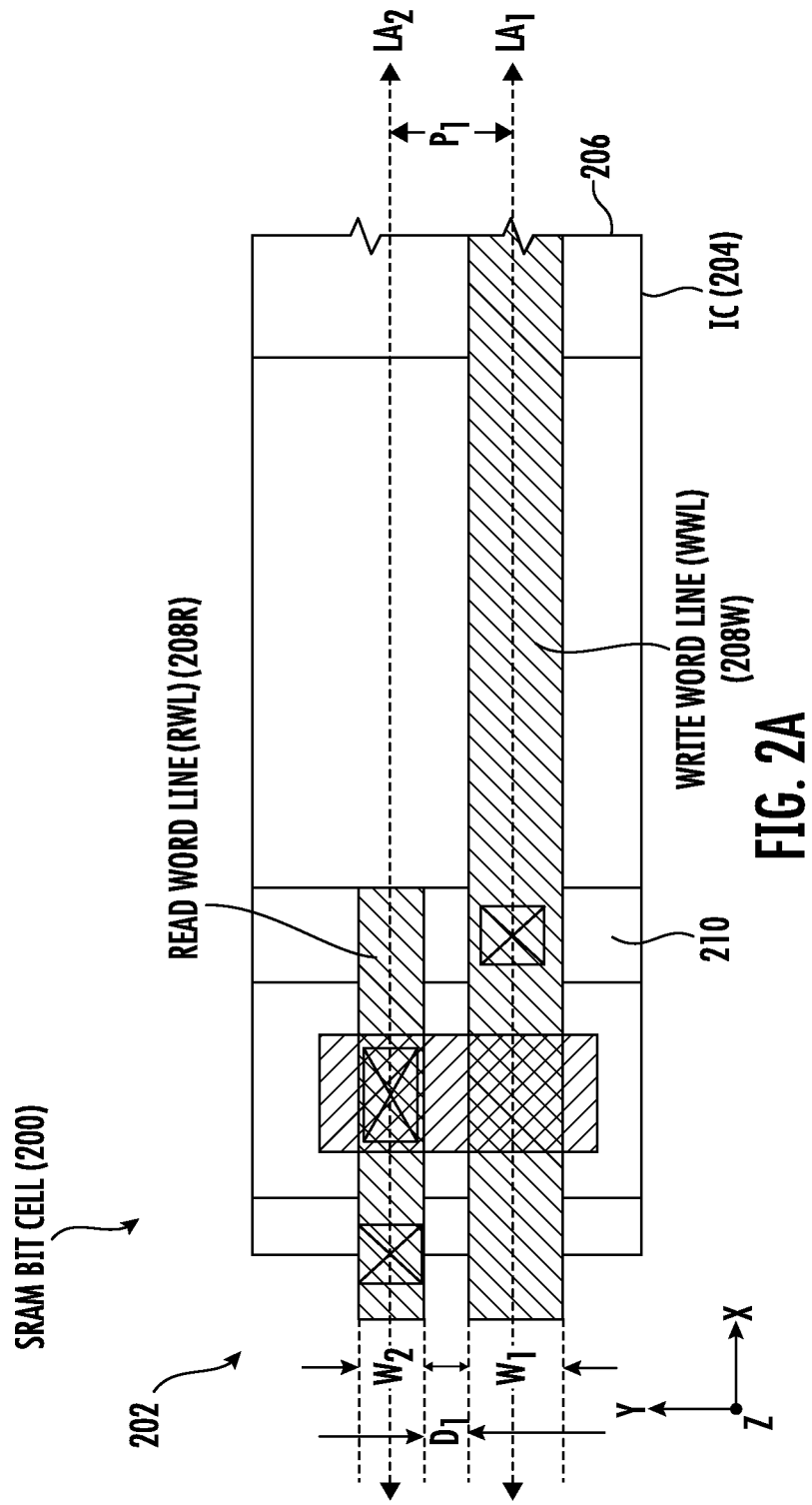
FIGS. 2A and 2B are top views of an exemplary SRAM bit cell according to a circuit cell design layout employing an increased width write word line based on a circuit cell layout area savings achieved by employing a reduced width read word line to reduce the resistance of the write word line for decreased memory write latency.

In this regard, FIG. 2A is a top view of an exemplary SRAM bit cell circuit 200 ("SRAM bit cell 200") according to a circuit cell layout 202. The SRAM bit cell 200 is part of an integrated circuit (IC) 204 that may be fabricated in a semiconductor die 206 for example. The SRAM bit cell 200 is configured to store a memory state of a logic value (e.g., '0' or '1') based on a charged voltage present on an internal storage node(s). The SRAM bit cell 200 can be included in a memory array that contains a plurality of the SRAM bit cells 200 (e.g., such as in a row and column organization) to constitute a memory for an electronic device, such as a processor-based system. As will be discussed in more detail below, the SRAM bit cell 200 employs a write word line (WWL) 208W having an increased width $W_1$ based on a savings of area in the circuit cell layout 202 achieved by employing a read word line (RWL) 208R with a reduced width $W_2$. The WWL 208W is a metal line as part of the SRAM bit cell 200 that is configured to carry a voltage signal that controls activation of a write operation in the SRAM bit cell 200 to write data to be stored in the SRAM bit cell 200. The RWL 208R is a metal line as part of the SRAM bit cell 200 that is configured to carry a voltage signal that controls activation of a read operation in the SRAM bit cell 200 to read data stored in the SRAM bit cell 200. Increasing the width $W_1$ of the WWL 208W can reduce the resistance of the WWL 208W yielding decreased memory write latency to the SRAM bit cell 200. For example, a ratio of the width $W_1$ of the WWL 208W to the width $W_2$ of the RWL 208R may be between 1.1-2.2.

It is desired to minimize the resistance of the SRAM bit cell 200 in which the WWL 208W and RWL 208R are included, to reduce the memory access latency to the SRAM bit cell 200. For example, the rise time of a voltage signal on the WWL 208W affects the activation of devices (e.g., transistors) in the SRAM bit cell 200 that control the latency of a memory write operation. Thus, in this example, the WWL 208W is fabricated to have a larger width $W_1$ than the width $W_2$ of the RWL 208R to reduce memory write latency. Similarly, the rise time of a voltage signal on the RWL 208R affects the activation of devices (e.g., transistors) in the SRAM bit cell 200 that control the latency of a memory read operation.

With continuing reference to FIG. 2A, the SRAM bit cell 200 in the IC 204 is fabricated according to place and route (PR) design rules based on fabrication technology such that there is a defined metal line pitch that governs the pitch or distance between the metal lines formed in the IC 204. In this example, the WWL 208W and RWL 208R are metal lines that are formed in a metal layer disposed above a semiconductor layer 210 of the IC 204. The WWL 208W is a metal line that extends along a longitudinal axis $LA_1$ extending in the direction of the X-axis shown in FIG. 2A. The WWL 208W has a width $W_1$ in the Y-axis direction orthogonal to the X-axis direction and direction of the longitudinal axis $LA_1$. The RWL 208R is a metal line that extends along a longitudinal axis $LA_2$ extending in the direction of the X-axis shown in FIG. 2A. The RWL 208R has a width $W_2$ in the Y-axis direction orthogonal to the X-axis direction and direction of the longitudinal axis $LA_2$. The metal line pitch of the SRAM bit cell 200 is shown as '$P_1$' in FIG. 2A. There is also a distance between metal lines formed in the IC 204, which is shown as distance $D_1$ between the WWL 208W and RWL 208R, to avoid or prevent shorting between metal lines.

The SRAM bit cell 200 in this example is fabricated such that the metal pitch $P_1$ is maintained to what it would be if the widths $W_1$, $W_2$ of the WWL 208W and RWL 208R were the same width. This may be important if it is desired to not change the metal pitch $P_1$ of the circuit cell layout 202 for compatibility or other process fabrication considerations. Also, in the SRAM bit cell 200 in FIG. 2A, the distance $D_1$ between the WWL 208W and RWL 208R is maintained to at least a designated minimum distance according to the fabrication technology available. This is accomplished by reducing the width $W_2$ of RWL 208R to provide for the additional area to enlarge the width $W_1$ of WWL 208W. The capacitance formed between the WWL 208W and RWL 208R can also be taken into consideration when deciding the distance $D_1$ between the WWL 208W and RWL 208R.

Depending on the circuit cell layout 202 desired for the SRAM bit cell 200, components of the SRAM bit cell 200 including the WWL 208W and RWL 208R and are fabricated in one or more metal layers that are disposed above the semiconductor layer 210 in the Z-axis direction in FIG. 2A. For example, as shown in another top view diagram of the SRAM bit cell 200 in FIG. 2B, the SRAM bit cell 200 in FIG. 2B includes a storage node 212 that is configured to store a charged voltage representing a memory state as a logic value (e.g., a logical '0' or '1'). For example, the storage node 212 may be formed by two cross-coupled inverter circuits like provided in a conventional six (6) transistor SRAM bit cell like in FIG. 1. A write access circuit 214W, which may be a negative-type (N-type) field-effect transistor (FET) (NFET) for example, is formed in the semiconductor layer 210 and coupled to the storage node 212 and the WWL 208W. The write access circuit 214W provides a write port to the SRAM bit cell 200. In this example, a voltage signal on the WWL 208W controls the activation of the write access circuit 214W to couple a write bitline to the storage node 212 for a write operation. For example, if the write access circuit 214W is an NFET, the NFET would be activated by applying a voltage signal on the WWL 208W to apply a gate-to-source voltage that meets or exceeds the threshold voltage of the NFET to activate the NFET. Data in the form of a voltage on a write bitline coupled to the write access circuit 214W is passed to the storage node 212 in response to the write access circuit 214W being activated for a write operation to the SRAM bit cell 200.

Figure 2B:
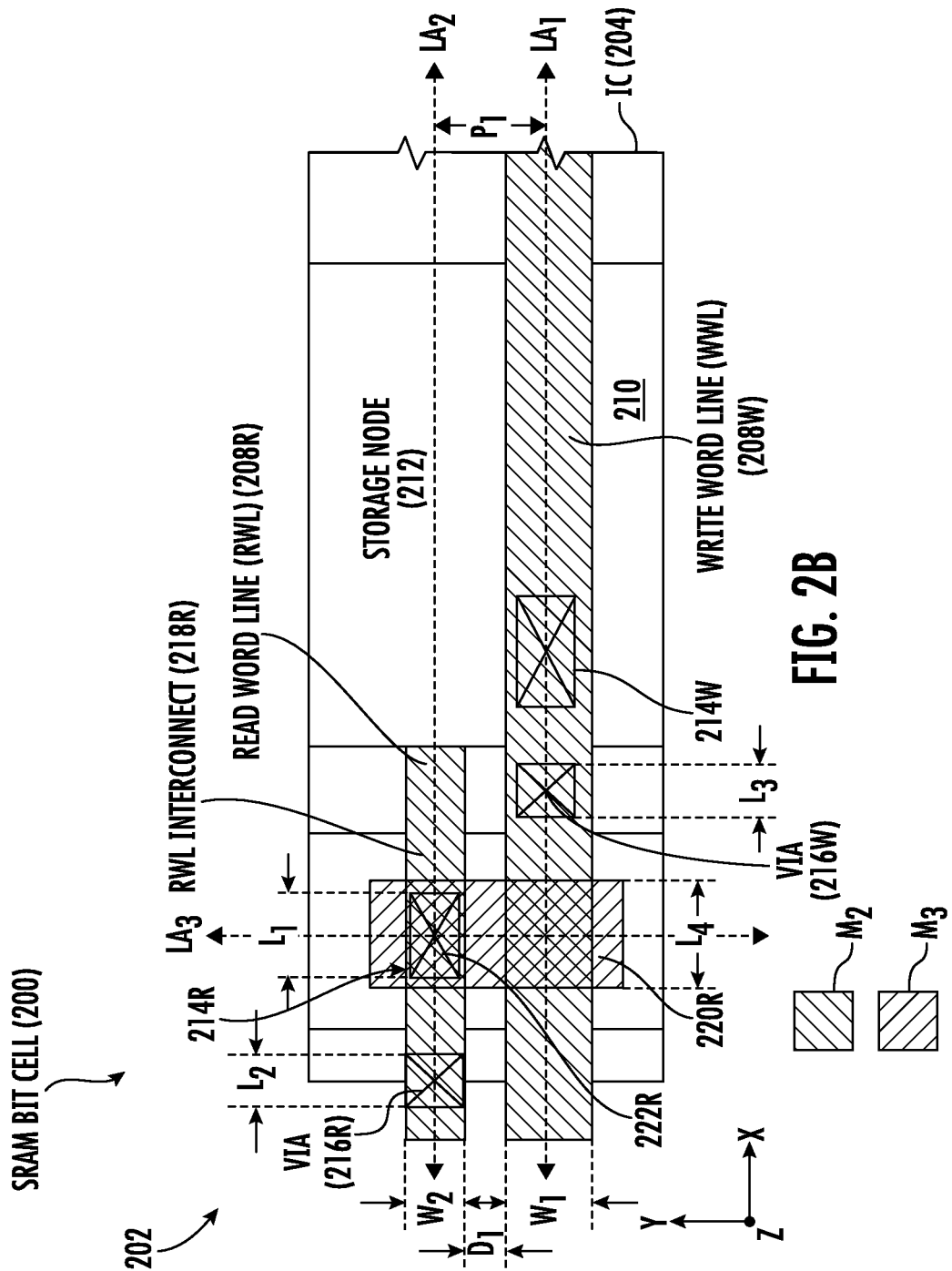

With continuing reference to FIG. 2B, a read access circuit 214R, which also may be an NFET for example, is formed in the semiconductor layer 210 and coupled to the storage node 212 and the RWL 208R. The read access circuit 214R provides a read port to the SRAM bit cell 200. In this example, a voltage signal on the RWL 208R controls the activation of the read access circuit 214R to couple the RWL 208R to the storage node 212 for a read operation. For example, if the read access circuit 214R is an NFET, the NFET would be activated by applying a voltage signal on the RWL 208R to apply a gate-to-source voltage that meets or exceeds the threshold voltage of the NFET to activate the NFET. Data stored in the storage node 212 in the form of a voltage is passed by the read access circuit 214R from the storage node 212 to a coupled read bitline in response to the read access circuit 214R being activated for a read operation to the SRAM bit cell 200.

The WWL 208W and RWL 208R may be provided in one or more metal layers in the IC 204 for the SRAM bit cell 200 depending on the design and the area available for placement and routing of the SRAM bit cell 200. In this example, the WWL 208W is disposed and routed in a second metal layer (M2 layer) above the semiconductor layer 210. The WWL 208W extends in the Z-axis direction into an adjacent SRAM bit cell (not shown) where the SRAM bit cell 200 is part of a row of SRAM bit cells in a memory array in the IC 204. The WWL 208W is coupled to the write access circuit 214W through a metal one layer (M1 layer) below the M2 layer by a WWL via 216W connected to the WWL 208W.

Also, in this example, the RWL 208R is disposed and routed in a second metal layer (M2 layer) above the semiconductor layer 210. The RWL 208R in this example is a RWL interconnect 218R that is used to distribute the RWL 208R in metal lines over several metal layers for routing. This may be because the routing of the WWL 208W in the M2 layer consumes too much area in the M2 layer to allow for full routing of the RWL 208R in the M2 layer. In this example, the RWL interconnect 218R is coupled to the storage node 212. The RWL interconnect 218R is also coupled to the read access circuit 214R below the M2 layer by a RWL via 216R. The RWL 208R also extends into a fourth metal layer (M4 layer) above the M2 layer. In this regard, to extend the coupling of the RWL interconnect 218R to the M4 layer, a second RWL interconnect 220R is provided in a third metal layer (M3 layer). The second RWL interconnect 220R has a longitudinal axis $LA_3$ in the Y-axis direction orthogonal to the longitudinal axis $LA_2$ of the RWL interconnect 218R. The RWL interconnect 218R in the M2 layer is connected to the second RWL interconnect 220R in the M3 layer by an intermediate RWL interconnect via 222R. As shown in FIG. 2B, the length $L_1$ of the RWL interconnect via 222R in its X-axis direction is enlarged over a length $L_2$ in the X-axis direction of the RWL via 216R and a length $L_3$ of the WWL via 216W in this example. In an example, the length $L_1$ of the RWL interconnect via 222R in its X-axis direction is enlarged over and greater than the length $L_2$ of the RWL via 216R and/or the length $L_3$ of the WWL via 216W by at least on 50%. Also, as shown in FIG. 2B, the length $L_4$ of the second RWL interconnect 220R is greater than the length $L_1$ of the RWL interconnect via 222R so that there is a full connection between the RWL interconnect via 222R and the second RWL interconnect 220R. Providing an enlarged width second RWL interconnect 220R and RWL interconnect via 222R can mitigate an increase in resistance in the RWL 208R that may occur as a result of the RWL interconnect 218R being reduced in width.

Figure 3:
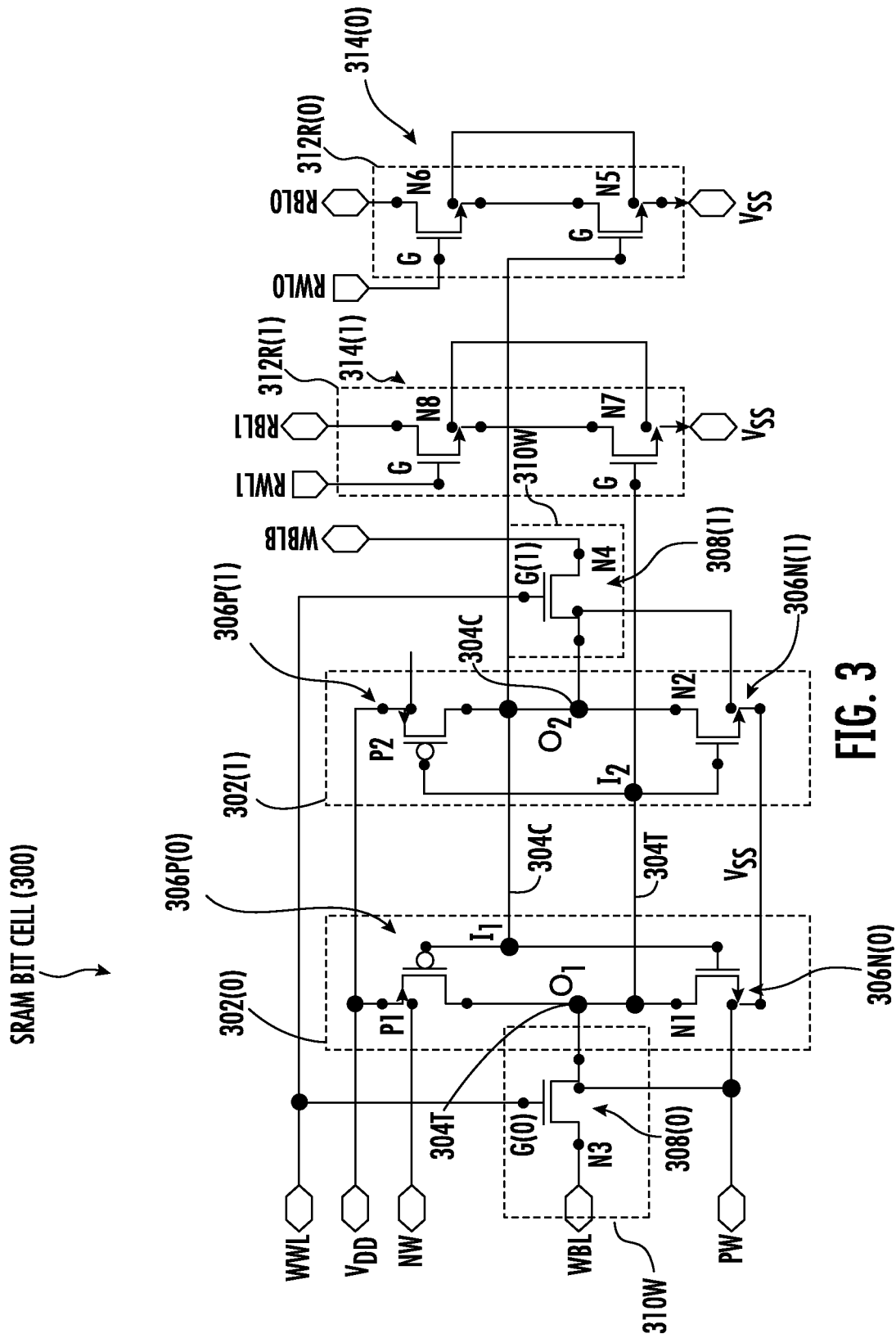
FIG. 3 is a diagram of an exemplary ten (10) transistor (10T) SRAM bit cell that has two (2) separate read ports and one (1) separate write port.

The SRAM bit cell 200 in FIGS. 2A and 2B has one read port and one write port into the storage node 212. However, it may be desired to provide an SRAM bit cell 200 that has more than one read port so that the storage node 212 can be read simultaneously by two circuit sources. In this regard, FIG. 3 is a diagram of an exemplary ten (10) transistor (10T) SRAM bit cell 300 that has two (2) separate read ports and one (1) separate write port. As discussed in more detail below starting at FIG. 4, the write port of the SRAM bit cell 300 includes a WWL that has an increased width in a circuit cell layout of the SRAM bit cell 300 by employing a reduced width RWLs of the read ports to reduce the resistance of the WWL for decreased memory write latency.

In this regard, the SRAM bit cell 300 comprises two (2) cross-coupled inverter circuits 302(0), 302(1) powered by supply voltage $V_{DD}$. The cross-coupled inverter circuits 302(0), 302(1) reinforce each other to retain data in the form of a voltage on a respective true storage node (T) 304T and a complement storage node (C) 304C. A first inverter input $I_1$ of the inverter circuit 302(0) is coupled to a second inverter output $O_2$ of the inverter circuit 302(1). A second inverter input $I_1$ of the inverter circuit 302(1) is coupled to a first inverter output $O_1$ of the inverter circuit 302(0). Each inverter circuit 302(0), 302(1) is comprised of a respective pull-up P-type field-effect transistor (PFET) 306P(0), 306P(1) (P1, P2) coupled in series to a respective pull-down N-type field-effect transistor (NFET) 306N(0), 306N(1) (N1, N2). Write access circuits 308(0), 308(1) in the form of NFET access transistors N3, N4 are coupled to the respective inverter circuits 302(0), 302(1) to provide a write port 310W to the SRAM bit cell 100. In a write operation, a write bitline WBL and the complement write bitline WBLB are pre-charged to voltages representing different logic values with the voltage on the write bitline WBL representing the logic value to be written. Then, a WWL coupled to gates G(0), G(1) of the NFET access transistors N3, N4 is asserted, which causes voltages to be asserted to the true storage node 304T and complement node 304C based on the voltages pre-charged on the write bitline WBL and the complement write bitline WBLB.

The SRAM bit cell 300 in FIG. 3 also includes two read ports 312R(0), 312R(1). Each read port 312R(0), 312R(1) includes a respective read access circuit 314(0), 314(1) in the form of NFETs N6, N8 whose gates G are coupled to respective read word lines RWL0, RWL1. The drains of the NFETs N6, N8 are coupled to respective read bitlines RBL0, RBL1. The NFETs N6, N8 are coupled to respective NFETs N5, N7 whose gates are coupled to the respective complement storage node 304C and true storage node 304T. In a read operation using read port 312R(0) as an example, the read bitline RBL0 is pre-charged to a voltage based on the supply voltage $V_{DD}$. Then, the read word line RWL0 coupled to the gate G of the NFET N6 is asserted to provide a current path from NFET N6 to NFET N5. The complement storage node 304C being coupled to the gate G of NFET N5 will either cause NFET N5 to turn on if complement storage node 304C is a logic '1' activation and pulling NFET N5 to ground or voltage $V_{SS}$ or to the voltage of the read bitline RBL0 if the complement storage node 304C is a logic '0'.

Figure 4:
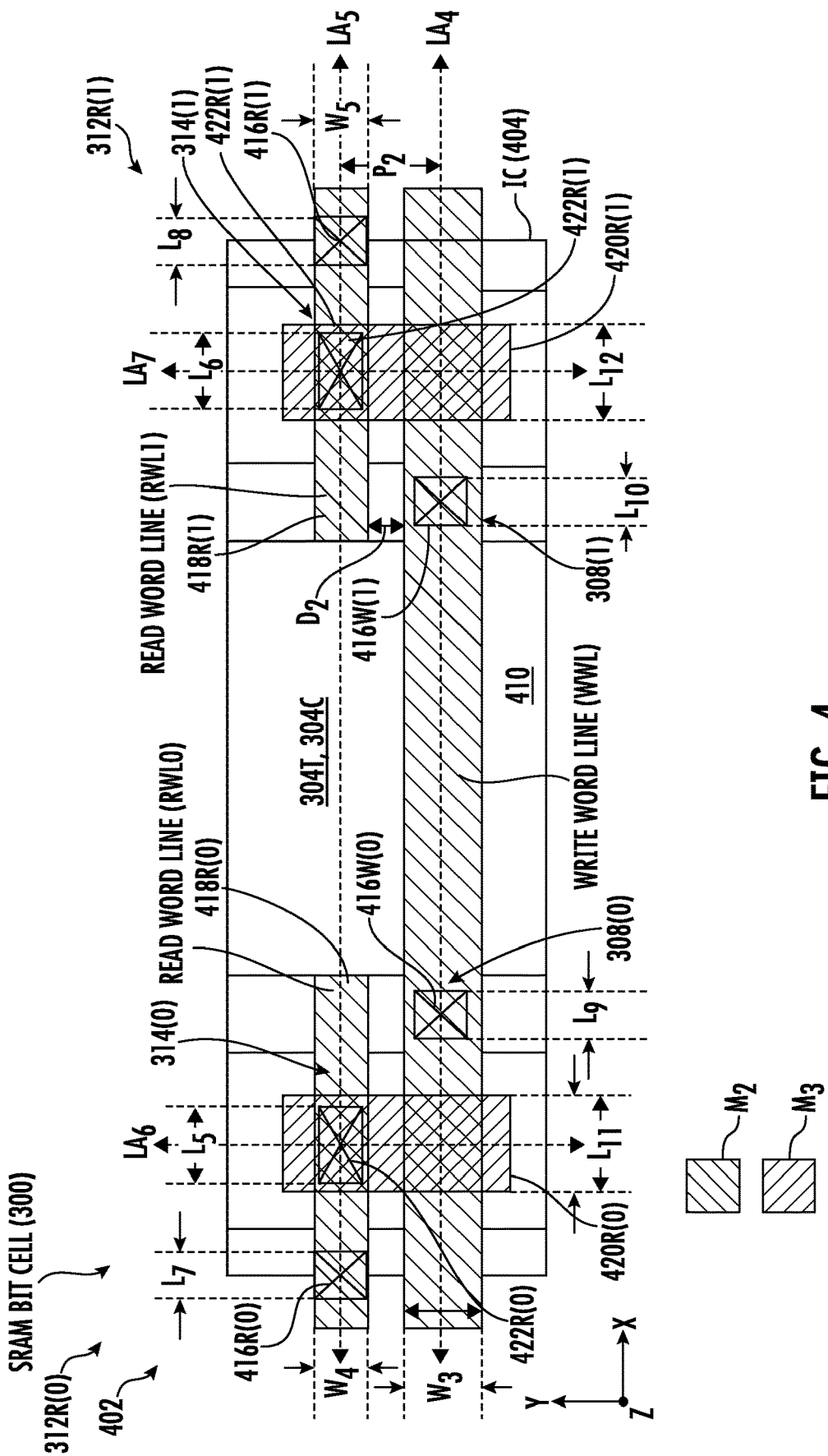
FIG. 4 is a top view of an exemplary circuit cell diagram of the SRAM bit cell in FIG. 3 according to a circuit cell design layout employing an increased width write word line for the write port based on a circuit cell layout area savings achieved by employing a reduced width read word line for the read ports to reduce the resistance of the write word line for decreased memory write latency.

FIG. 4 is a top view of an exemplary circuit cell diagram of the SRAM bit cell 300 in FIG. 3 according to a circuit cell layout 402 employing an increased width WWL for the write port 310W based on a circuit cell layout area savings achieved by employing a reduced width read word lines RWL0 and RWL1 for their respective read ports 312R(0), 312R(1) to reduce the resistance of the WWL for decreased memory write latency. The read ports 312R(0), 312R(1) are disposed on each side of the true and complement storage nodes 304T, 304C for symmetry. The SRAM bit cell 300 can be included in a memory array that contains a plurality of the SRAM bit cells 300 (e.g., such as in a row and column organization) to constitute a memory for an electronic device, such as a processor-based system. As will be discussed in more detail below, the SRAM bit cell 300 employs a write word line WWL having an increased width $W_3$ based on a savings of area in the circuit cell layout 402 achieved by employing read word lines RWL0, RWL1 with a reduced widths $W_4$, $W_5$ less than the width $W_3$ of the write word line WWL. For example, widths $W_4$, $W_5$ of the read word lines RWL0, RWL1 may be 20-24 nm, and the width $W_3$ of the write word line WWL may be 35-40 nm. The write word line WWL is a metal line as part of the SRAM bit cell 300 that is configured to carry a voltage signal that controls activation of a write operation in the SRAM bit cell 300 to write data to be stored in the SRAM bit cell 300. The read word lines RWL0, RWL1 are metal lines as part of the SRAM bit cell 300 that is configured to carry a voltage signal that controls activation of a read operation in the SRAM bit cell 300 to read data stored in the SRAM bit cell 300. Increasing the width $W_3$ of the write word line WWL can reduce the resistance of the write word line WWL yielding decreased memory write latency to the SRAM bit cell 300. For example, a ratio of the width $W_3$ of the write word line WWL to the width $W_4$ or width $W_5$ of either or both of the read word lines RWL0, RWL1 may be between 1.1-2.2.

It is desired to minimize the resistance of the SRAM bit cell 300 in which the write word line WWL and read word lines RWL0, RWL1 are included, to reduce the memory access latency to the SRAM bit cell 300. For example, the rise time of a voltage signal on the write word line WWL affects the activation of devices (e.g., transistors) in the SRAM bit cell 300 that control the latency of a memory write operation. Thus, in this example, the write word line WWL is fabricated to have a larger width $W_3$ than the widths $W_4$, $W_5$ of the read word lines RWL0, RWL1 to reduce memory write latency. Similarly, the rise time of a voltage signal on the read word lines RWL0, RWL1 affects the activation of devices (e.g., transistors) in the SRAM bit cell 300 that control the latency of a memory read operation.

With continuing reference to FIG. 4, the SRAM bit cell 300 is fabricated in an IC 404 according to place and route (PR) design rules based on fabrication technology such that there is a defined metal line pitch that governs the pitch or distance between the metal lines formed in the IC 404. In this example, the write word line WWL and read word lines RWL0, RWL1 are metal lines that are formed in metal layers disposed above a semiconductor layer 410 of the IC 404. The write word line WWL is a metal line that extends along a longitudinal axis $LA_4$ extending in the direction of the X-axis shown in FIG. 4. The write word line WWL has a width $W_3$ in the Y-axis direction orthogonal to the X-axis direction and direction of the longitudinal axis $LA_4$. The read word lines RWL0, RWL1 are metal lines that extend along a longitudinal axis $LA_3$ extending in the direction of the X-axis shown in FIG. 4. The read word lines RWL0, RWL1 have respective widths $W_4$, $W_5$ in the Y-axis direction orthogonal to the X-axis direction and direction of the longitudinal axis $LA_5$. The metal line pitch of the SRAM bit cell 300 is shown as '$P_2$' in FIG. 4. For example, the metal line pitch $P_2$ may be 48-54 nanometers (nm). There is also a distance between metal lines formed in the IC 404, which is shown as distance $D_2$ between the write word line WWL and read word lines RWL0, RWL1, to avoid or prevent shorting between metal lines. For example, the distance $D_2$ may be 22-24 nm.

The SRAM bit cell 300 in this example is fabricated such that the metal pitch $P_2$ is maintained to what it would be if the widths $W_3$, $W_4$, $W_5$ of the write word line WWL and read word lines RWL0, RWL1 were the same width. This may be important if it is desired to not change the metal pitch $P_2$ of the circuit cell layout 402 for compatibility or other process fabrication considerations. Also, in the SRAM bit cell 300 in FIG. 4, the distance $D_2$ between the write word line WWL and the read word lines RWL0, RWL1 is maintained to at least a designated minimum distance according to the fabrication technology available. This is accomplished by reducing the widths $W_4$, $W_5$ of read word lines RWL0, RWL1 to provide for the additional area to enlarge the width $W_3$ of write word line WWL. The capacitance formed between the write word line WWL and read word lines RWL0, RWL1 can also be taken into consideration when deciding the distance $D_2$ between the write word line WWL and the read word lines RWL0, RWL1.

Depending on the circuit cell layout 402 desired for the SRAM bit cell 300, components of the SRAM bit cell 300 including the write word line WWL and the read word lines RWL0, RWL1 and are fabricated in one or more metal layers that are disposed above the semiconductor layer 410 in the Z-axis direction in FIG. 4. For example, as shown in the SRAM bit cell 300 in FIG. 4, the SRAM bit cell 300 in includes the true and complement storage nodes 304T, 304C described in FIG. 3 that are configured to store charged voltages representing a memory state as a logic value (e.g., a logical '0' or '1'). The write access circuits 308(0), 308(1), are formed in the semiconductor layer 410 and coupled to the respective true and complement storage nodes 304T, 304C and the write word line WWL. As discussed in FIG. 3, the write access circuits 308(0), 308(1) provide a write port to the SRAM bit cell 300. In this example, a voltage signal on the write word line WWL controls the activation of the write access circuits 308(0), 308(1) to couple the write bitlines WBL, WBLB (FIG. 3) to the respective true and complement storage nodes 304T, 304C for a write operation. Data in the form of a voltage on write bitlines WBL, WBLB coupled to the write access circuits 308(0), 308(1) is passed to the respective true and complement storage nodes 304T, 304C in response to the write access circuits 308(0), 308(1) being activated for a write operation to the SRAM bit cell 300.

With continuing reference to FIG. 4, the read access circuits 314(0), 314(1) are formed in the semiconductor layer 410 and coupled to the true and complement storage nodes 304T, 304C and the respective read word lines RWL0, RWL1. In this example, a voltage signal on the read word lines RWL0, RWL1 controls the activation of the read access circuits 314(0), 314(1) to couple the respective read bitlines RBL0, RLB1 (FIG. 3) to the storage nodes 304T, 304C for a read operation. Data stored in the true and complement storage nodes 304T, 304C in the form of a voltage is passed by the read access circuits 314(0), 314(1) from the respective true and complement storage nodes 304T, 304C to a coupled read bitline RBL0, RLB1 in response to the read access circuit 314(0), 314(1) being activated for a read operation to the SRAM bit cell 300.

The write word line WWL and read word lines RWL0, RWL1 may be provided in one or more metal layers in the IC 404 for the SRAM bit cell 300 depending on the design and the area available for placement and routing of the SRAM bit cell 300. In this example, the write word line WWL is disposed and routed in a second metal layer (M2 layer) above the semiconductor layer 410. The write word line WWL extends in the X-axis direction into an adjacent SRAM bit cell (not shown) where the SRAM bit cell 300 is part of a row of SRAM bit cells in a memory array in the IC 404. The write word line WWL is coupled to the write access circuit 308(0), 308(1) through a metal one layer (M1 layer) below the M2 layer by a WWL via 416W(0), 416W(1) connected the write word line WWL.

Also, in this example, the read word lines RWL0, RWL1 are disposed and routed in a second metal layer (M2 layer) above the semiconductor layer 410. The read word line RWL0 in the M2 layer is a RWL interconnect 418R(0) that is used to distribute the read word line RWL0 in metal lines over several metal layers for routing. The read word line RWL1 in the M2 layer is a RWL interconnect 418R(1) that is used to distribute the read word line RWL1 in metal lines over several metal layers for routing. This may be because the routing of the write word line WWL in the M2 layer consumes too much area in the M2 layer to allow for full routing of the read word lines RWL0, RWL1 in the M2 layer. The RWL interconnects 418R(0), 418R(1) are disconnected as shown in the M2 layer. In this regard, in this example, the RWL interconnects 418R(0), 418R(1) are coupled to the respective read access circuits 314(0), 314(1) through a metal one layer (M1 layer) below the M2 layer by respective RWL vias 416R(0), 416R(1). The read word lines RWL0, RWL1 also extend into a fourth metal layer (M4 layer) above the M2 layer. In this regard, to extend the coupling of the RWL interconnects 418R(0), 418R(1) to the M4 layer, second RWL interconnects 420R(0), 420R(1) are provided in a third metal layer (M3 layer). The second RWL interconnects 420R(0), 420R(1) each have longitudinal axes $LA_6$, $LA_7$ in the Y-axis direction orthogonal to the longitudinal axis $LA_3$ of the RWL interconnects 418R(0), 418R(1). The RWL interconnects 418R(0), 418R(1) in the M2 layer are connected to the respective second RWL interconnects 420R(0), 420R(1) in the M3 layer by respective intermediate RWL interconnect vias 422R(0), 422R(1).

As shown in FIG. 4, lengths $L_5$, $L_6$ of the respective RWL interconnect vias 422R(0), 422R(1) in its X-axis direction are enlarged over lengths $L_7$, $L_8$ of the RWL vias 416R(0), 416R(1) in the X-axis direction, and lengths $L_9$, $L_{10}$ of the WWL vias 416W(0), 416W(1) in the X-axis direction in this example. In an example, the lengths $L_5$, $L_6$ of the RWL interconnect vias 422R(0), 422R(1) in its X-axis direction are enlarged over and greater than the widths $W_4$ $W_5$ of the read write lines RWL0, RWL1 and/or the lengths $L_9$, $L_{10}$ of the WWL vias 416W(0), 416W(1) by at least on 50%. Also, as shown in FIG. 4, lengths $L_{11}$, $L_{12}$ of the RWL interconnects 420R(0), 420R(1) in the X-axis direction are greater than the lengths $L_5$, $L_6$ of the RWL interconnect vias 422R(0), 422R(1) so that there is a full connection between the RWL interconnect vias 422R(0), 422R(1) and the respective RWL interconnects 420R(0), 420R(1). For example, the lengths $L_{11}$, $L_{12}$ of the RWL interconnects 420R(0), 420R(1) may be 62 nm. The lengths $L_5$, $L_6$ of the RWL interconnect vias 422R(0), 422R(1) may be 35-40 nm. Providing enlarged width RWL interconnects 420R(0), 420R(1) and RWL interconnect vias 422R(0), 422R(1) can mitigate an increase in resistance in the read word lines RWL0, RWL1 that may occur as a result of their respective RWL interconnects 418R(0), 418R(1) being reduced in width.

Figure 5:
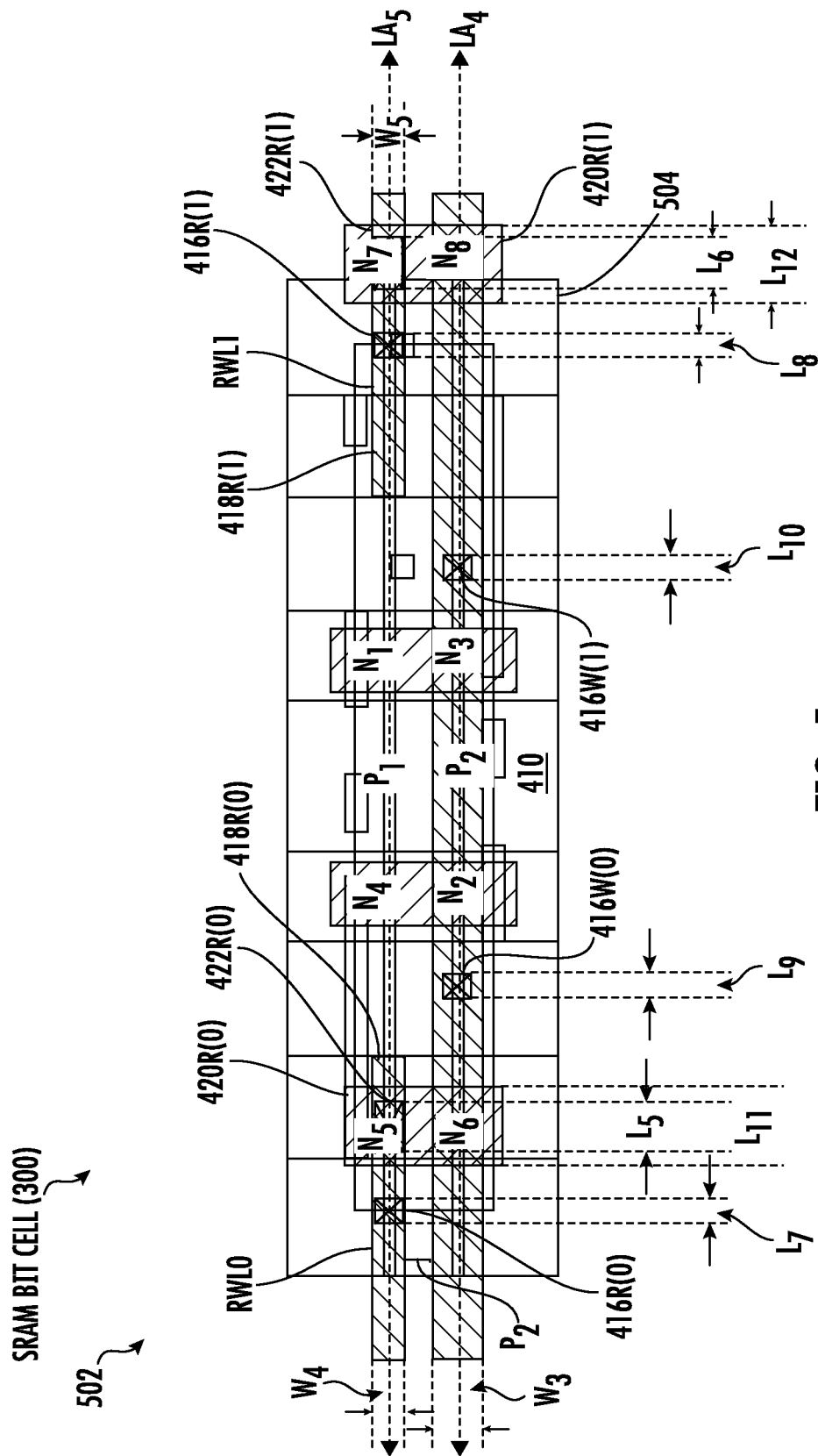
FIG. 5 is a top view of another exemplary, more detailed circuit cell diagram of the SRAM bit cell in FIG. 4.

FIG. 5 is another top view of the SRAM bit cell 300 in FIG. 4 according to a circuit cell design layout 502 for illustrative purposes. Common elements between the SRAM bit cell 300 in FIGS. 3 and 4 are shown in FIG. 5 and are not redescribed. The SRAM bit cell 300 in FIG. 5 is fabricated in an IC 504 according to place and route (PR) design rules based on fabrication technology such that there is a defined metal line pitch that governs the pitch or distance between the metal lines formed in the IC 504. The NFETs N1-N8 shown in the SRAM bit cell 300 in FIG. 3 are shown as N1-N8 in the SRAM bit cell 300 in FIG. 5. The PFETs P1, P2 shown in the SRAM bit cell 300 in FIG. 3 are shown as P1, P2 in the SRAM bit cell 300 in FIG. 5.

Figure 6A:
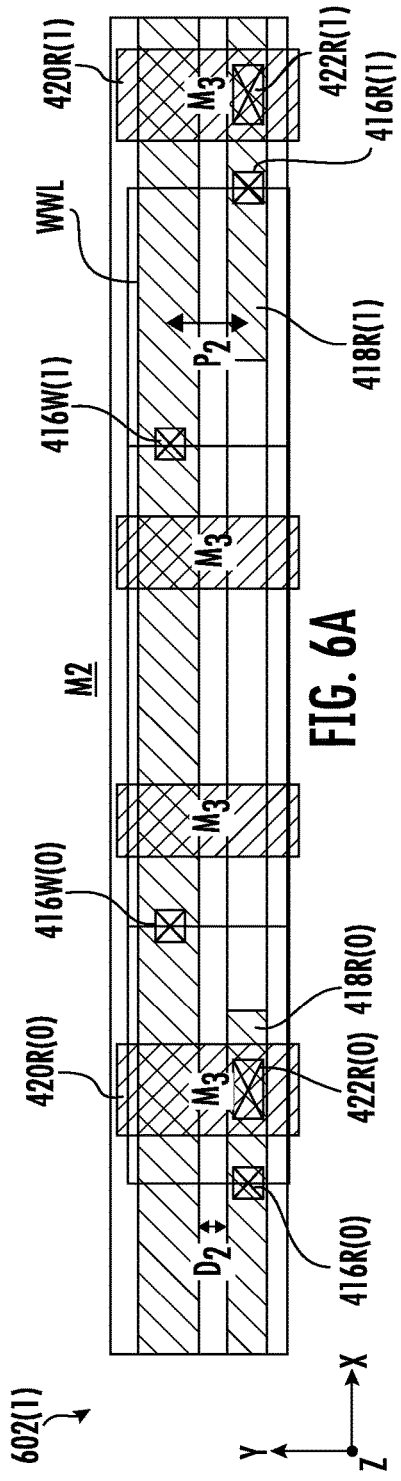
FIGS. 6A-6C are top views of exemplary circuit cell diagrams of layers of the SRAM bit cell in FIG. 5.
Figure 6B:
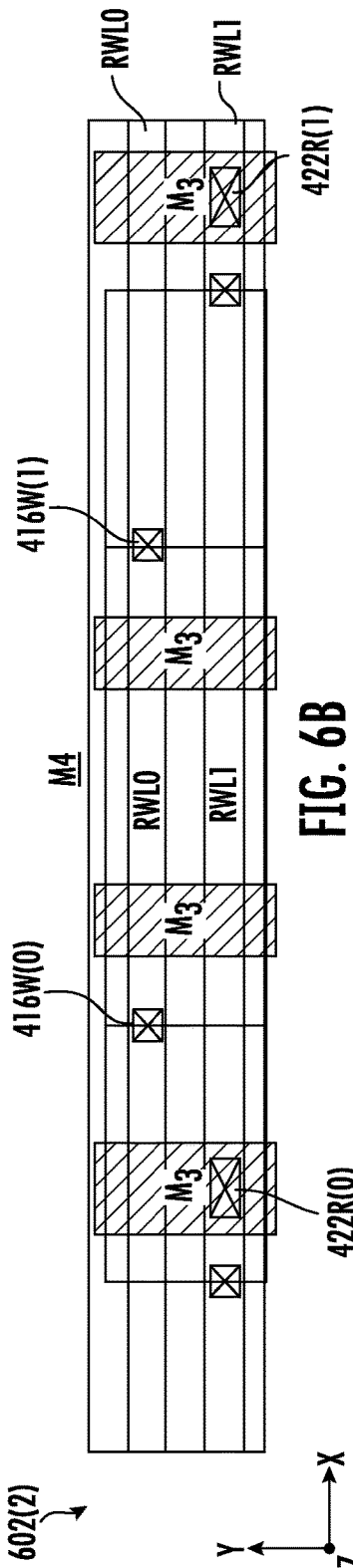
Figure 6C:
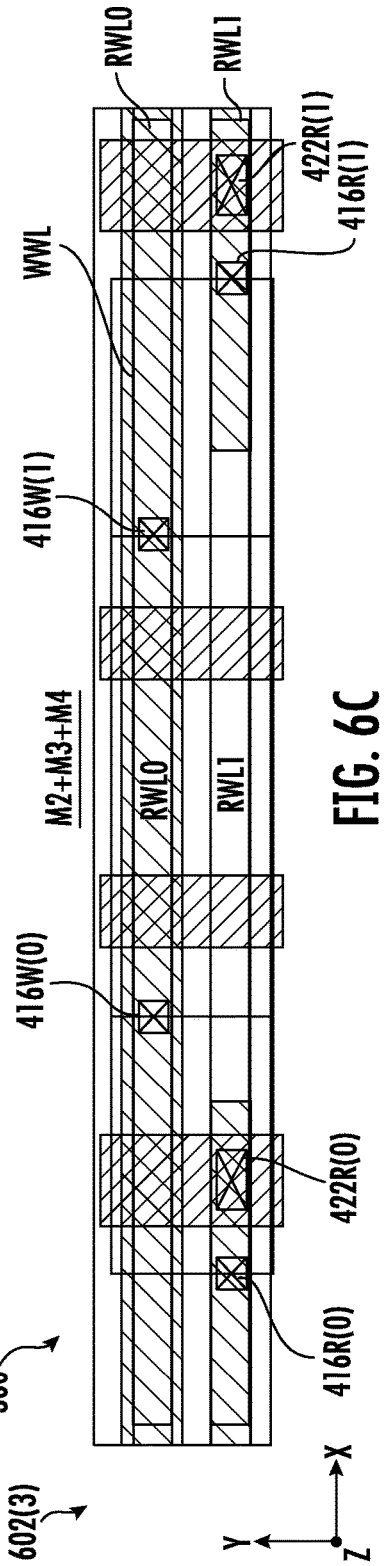

To illustrate further detail of the exemplary layout of the SRAM bit cell 300, FIGS. 6A-6C are provided. FIG. 6A-6C are top views of exemplary circuit cell layouts 602(1), 602(2) of the M2 and M4 layers, and a circuit cell layout 602(3) of the combined M2, M3, and M4 layers of the SRAM bit cell 300 in FIG. 5. FIG. 6A illustrates a top view of the M2 layer of the SRAM bit cell 300. Common elements between the SRAM bit cell 300 in FIG. 5 and the M2 layer of the SRAM bit cell 300 in FIG. 6A are shown with common elements and not re-described. FIG. 6B illustrates a layout 602(2) the metal four (M4) layer of the SRAM bit cell 300 in FIG. 5. As shown in FIG. 6B, the read word lines RWL0, RWL1 extend continuously in the X-axis direction. RWL interconnect vias 422R(0), 422R(1) are shown that connect the read word lines RWL0, RWL1 in the M4 layer to the RWL interconnect 420R(0), 420R(1) in the M3 layer to be connected to the discontinuous RWL interconnects 418R(0), 418R(1) in the M2 layer. FIG. 6C illustrates layout 602(3) of the combined M2, M3, and M4 layers in the layouts 602(1), 602(2) in FIGS. 6A and 6B.

Figure 7:
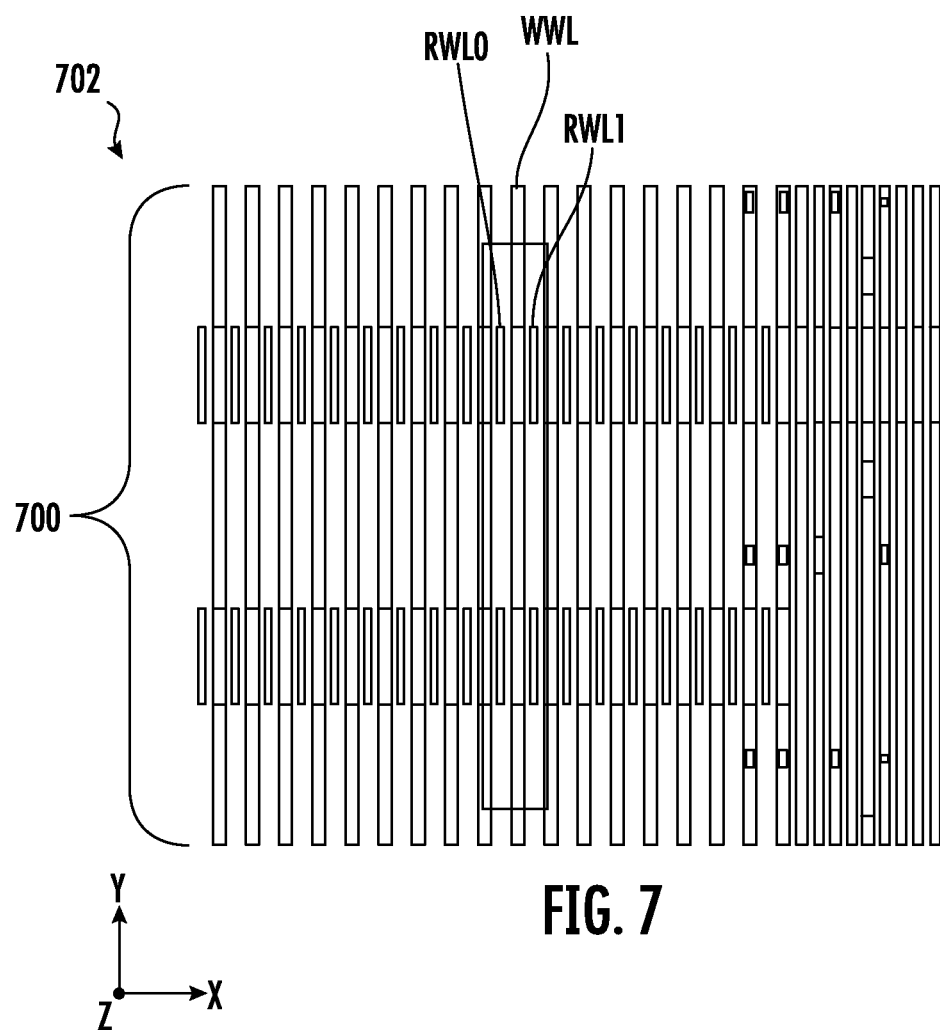
FIG. 7 is a top view of an exemplary semiconductor die that shows write and read word lines for multiple SRAM bit cells like the SRAM bit cell in FIG. 5.

FIG. 7 is a top view of a metal layer 700 in an exemplary semiconductor die 702 that includes write word lines and read word lines for multiple SRAM bit cells like the SRAM bit cell 300 in FIG. 5. FIG. 7 illustrates that it is feasible to provide reduced width read word lines RWL0, RWL1 in the Y-axis direction disposed between enlarged width write word lines WWL in the Y-axis direction. FIG. 7 illustrates elongated continuous write word lines with discontinuous read word lines RWL0, RWL1 disposed on each side like shown in the SRAM bit cell 300 in FIG. 5. The semiconductor die 702 includes a plurality of SRAM bit cells disposed adjacent to each other such that a pattern of reduced width read word lines RWL0, RWL1 are disposed between enlarged width write word lines WWL.

Figure 8:
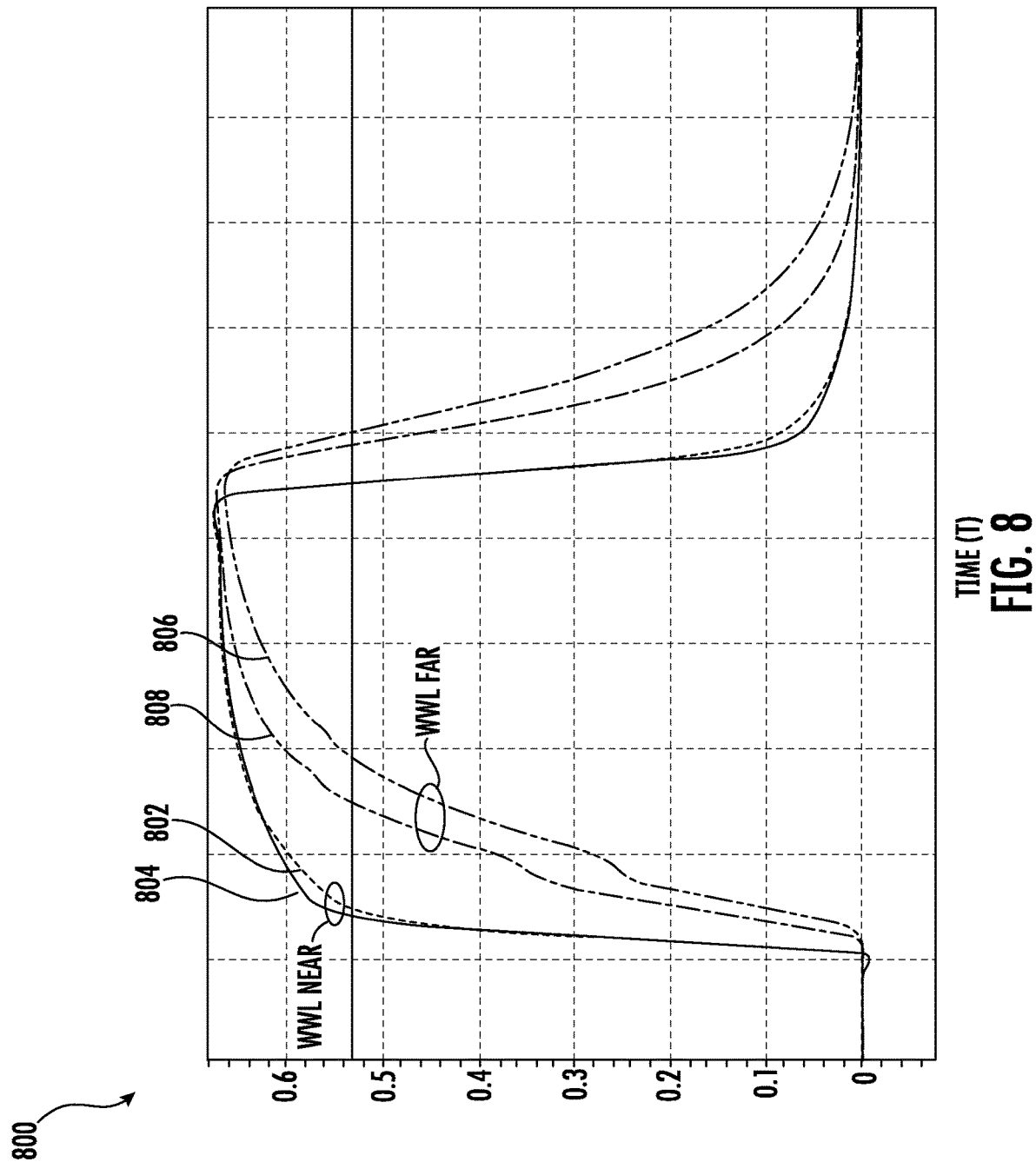
FIG. 8 is a graph illustrating exemplary timing of risings in voltage levels on write word lines of the SRAM bit cell in FIG. 5 for exemplary comparison purposes.

FIG. 8 is a graph 800 illustrating exemplary timing of risings in voltage levels for write operations in SRAM bit cells with enlarged width write word lines like the SRAM bit cell 300 in FIG. 5 and without the enlarged write word lines for exemplary comparison purposes. As shown in FIG. 8, the exemplary rise time of write word line (WWL) for an SRAM bit cell nearest a write line driver circuit that does not include an enlarged width WWL like the SRAM bit cell 300 in FIG. 5 is shown as curve 802. The rise time of WWL for the SRAM bit cell 300 in FIG. 5 nearest a write line driver circuit is shown as curve 804, which illustrates a faster rise time. The faster rise time of the WWL of the SRAM bit cell 300 in FIG. 5 is due to the reduced resistance of the WWL due to the WWL being enlarged. The faster rise time may also reduce memory write latency and not require as wide of a write pulse on the WWL due to the faster rise time. The exemplary rise time of WWL for an SRAM bit cell farthest from a write line driver circuit that does not include an enlarged width write word line like the SRAM bit cell 300 in FIG. 5 is shown as curve 806. The rise time of WWL for the SRAM bit cell 300 in FIG. 5 farthest from a write line driver circuit is shown as curve 808, which illustrates a faster rise time.

Figure 9:
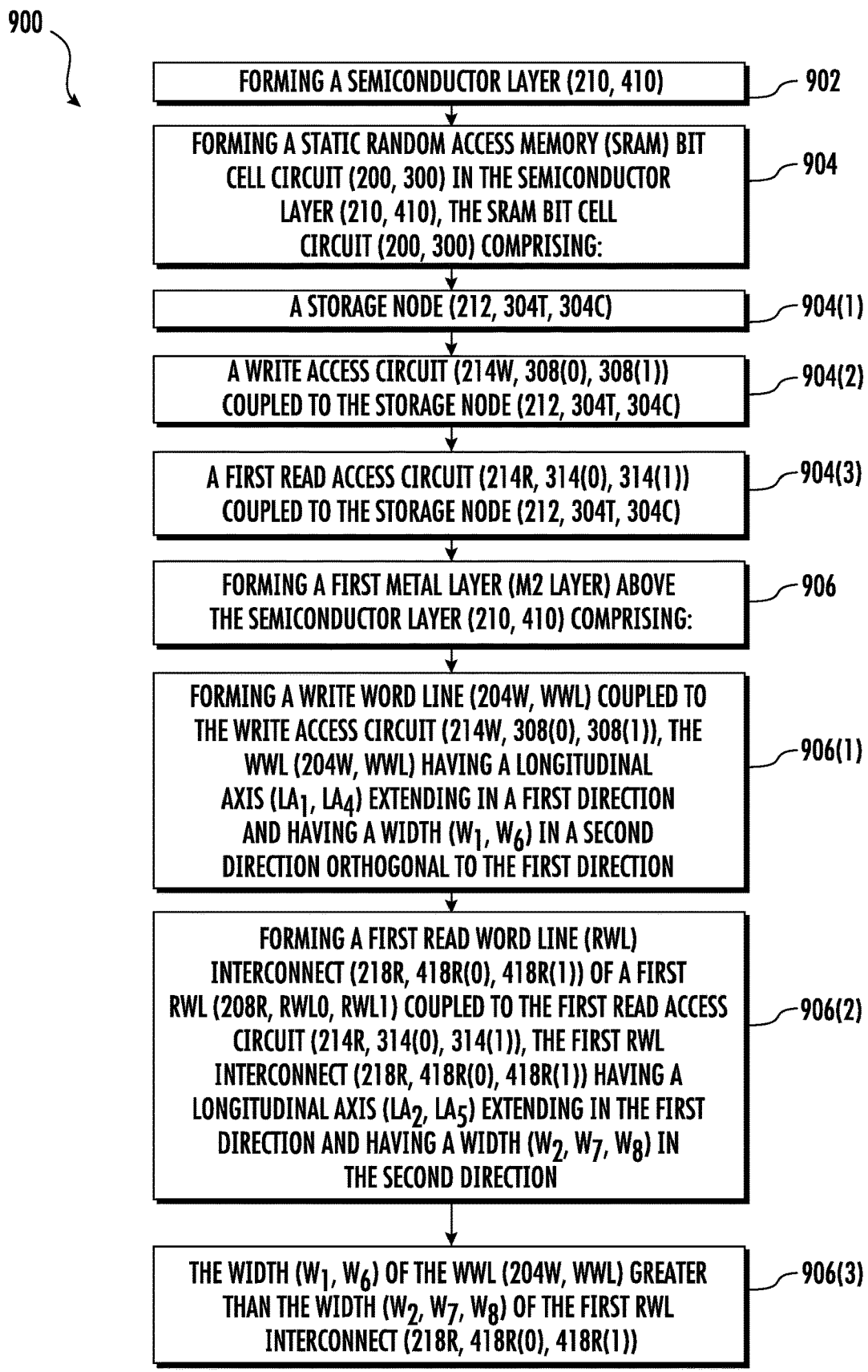
FIG. 9 is a flowchart illustrating an exemplary process of fabricating an SRAM bit cell according to a circuit cell design layout employing an increased width write word line based on a circuit cell layout area savings achieved by employing a reduced width read word line to reduce the resistance of the write word line for decreased memory write latency, including but not limited to the SRAM bit cells in FIGS. 2A-6C.

FIG. 9 is a flowchart illustrating an exemplary process 900 of fabricating an SRAM bit cell according to a circuit cell design layout employing an increased width write word line based on a circuit cell layout area savings achieved by employing a reduced width read word line to reduce the resistance of the write word line for decreased memory write latency, including but not limited to the SRAM bit cells 200, 300 in FIGS. 2A-6C. The process 900 in FIG. 9 will be described in reference to the exemplary SRAM bit cells 200, 300 in FIGS. 2A and 3-6C. In this regard, as shown in FIG. 9, the process 900 includes forming a semiconductor layer 210, 410 (block 902 in FIG. 9). The process 900 also includes forming an SRAM bit cell 200, 300 in the semiconductor layer 210, 410 (block 904 in FIG. 9). The SRAM bit cell 200, 300 comprises a storage node 212, 304T, 304C) (block 904(1)), a write access circuit 214W, 308(0), 308(1) coupled to the storage node 212, 304T, 304C (block 904(2)), and a first read access circuit 214R, 314(0), 314(1) coupled to the storage node 212, 304T, 304C (block 904(3)). The process 900 also includes forming a first metal layer (M2 layer) above the semiconductor layer 210, 410 (block 906 in FIG. 9). Forming the M2 layer comprises forming a WWL 204W coupled to the write access circuit 214W, 308(0), 308(1), the WWL 204W having a longitudinal axis $LA_1$, $LA_4$ extending in a first direction and having a width ($W_1$, $W_3$) in a second direction orthogonal to the first direction (block 906(1)), forming a first RWL interconnect 218R, 418R(0), 418R(1) of a first RWL 208R, RWL0, RWL1 coupled to the first read access circuit 214R, 314(0), 314(1), wherein the first RWL interconnect 218R, 418R(0), 418R(1) has a longitudinal axis $LA_2$, $LA_5$ extending in the first direction and having a width $W_2$, $W_4$, $W_5$ in the second direction (block 906(2)), and wherein the width $W_1$, $W_3$ of the WWL 204W is greater than the width $W_2$, $W_4$, $W_5$ of the first RWL interconnect 218R, 418R(0), 418R(1) (block 906(3)).

Figure 10:
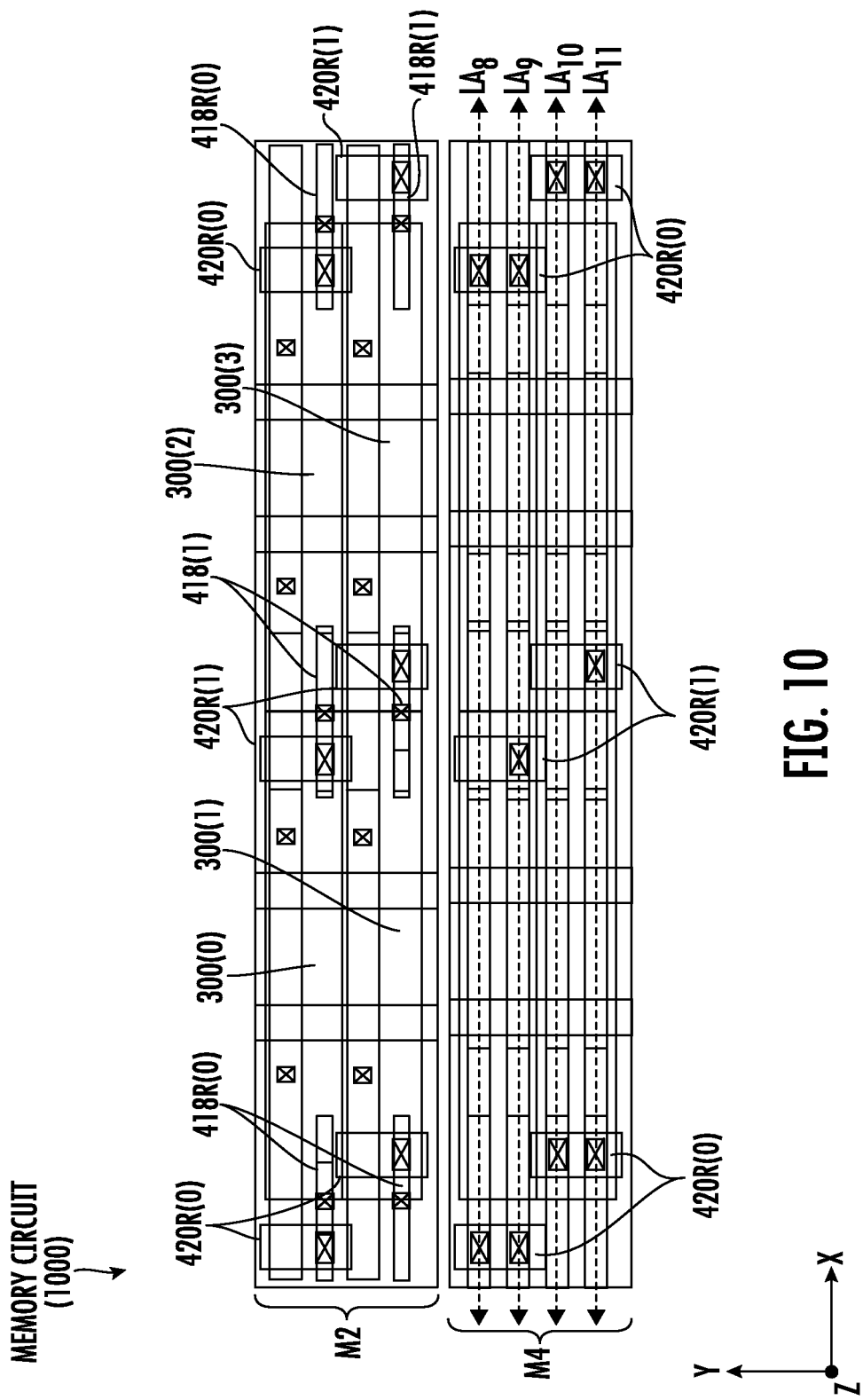
FIG. 10 is a diagram of a memory circuit that includes a plurality of SRAM bit cells according to a circuit cell design layout employing an increased width write word line based on a circuit cell layout area savings achieved by employing a reduced width read word line to reduce the resistance of the write word line for decreased memory write latency.

FIG. 10 is a diagram of a memory circuit 1000 that includes a plurality of SRAM bit cells 300(0)-300(3) like the SRAM bit cell 300 in FIGS. 4-6C. SRAM bit cells 300(0) and 300(1) form a 2×1 SRAM bit cell array, and SRAM bit cells 300(2) and 300(3) form another 2×1 SRAM bit cell array. Overall, the memory circuit 1000 has a 2×2 array of the SRAM bit cells 300(0)-300(3). The M2 and M4 layers of the memory circuit 1000 are shown in FIG. 10. As shown in the M4 layer, the read write lines RWL0-RWL3 for the respective SRAM bit cells 300(0)-300(3) extend in the X-axis direction along longitudinal axes $LA_8$-$LA_{11}$ that extend parallel to each other such that the read write lines RWL0-RWL3 are non-overlapping. The SRAM bit cell 300 design in FIGS. 4-6C with enlarged width WWLs and reduced width RWL interconnects 418R(0), 418R(1) still allows the read write lines RWL0-RWL3 to be routed without overlapping each other in the M4 layer as shown in FIG. 10.

It is noted that the terms "above," "top," "below" "bottom" where used herein are relative terms and are not meant to limit or imply a strict orientation or that such is with reference to the ground. An element referenced as above or on top of another element is relative to the orientation of those two elements. An element referenced as below or on the bottom of another element is also relative to the orientation of those two elements.

Memory that includes SRAM bit cells according to a circuit cell design layout employing an increased width write word line based on a circuit cell layout area savings achieved by employing a reduced width read word line to reduce the resistance of the write word line for decreased memory write latency, including but not limited to the SRAM bit cells in FIGS. 2A-6C, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 11:
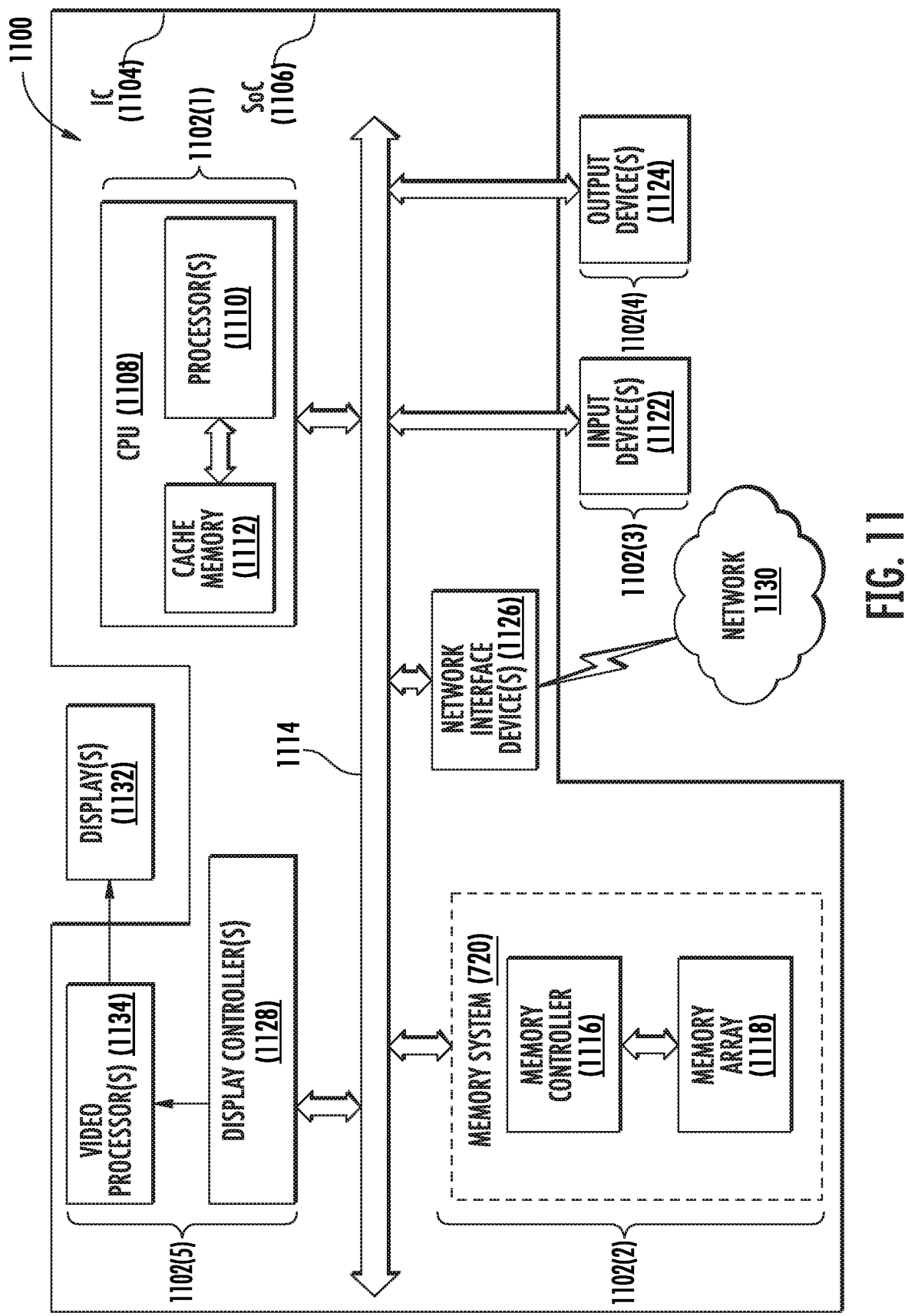
FIG. 11 is a block diagram of an exemplary processor-based system that can include a memory(ies) that includes SRAM bit cells according to a circuit cell design layout employing an increased width write word line based on a circuit cell layout area savings achieved by employing a reduced width read word line to reduce the resistance of the write word line for decreased memory write latency, including but not limited to the SRAM bit cells in FIGS. 2A-6C.

In this regard, FIG. 11 illustrates an example of a processor-based system 1100 that can include memory that includes SRAM bit cells 1102(1)-1102(5) according to a circuit cell design layout employing an increased width write word line based on a circuit cell layout area savings achieved by employing a reduced width read word line to reduce the resistance of the write word line for decreased memory write latency, including but not limited to the SRAM bit cells in FIGS. 2A-6C, and according to any aspects disclosed herein. In this example, the processor-based system 1100 may be formed as an IC 1104 as a system-on-a-chip (SoC) 1106. The processor-based system 1100 includes a CPU 1108 that includes one or more processors 1110, which may also be referred to as CPU cores or processor cores. The CPU 1108 may have a cache memory 1112 coupled to the CPU 1108 for rapid access to temporarily stored data. The cache memory 1112 can include SRAM bit cells 1102(1) according to a circuit cell design layout employing an increased width write word line based on a circuit cell layout area savings achieved by employing a reduced width read word line to reduce the resistance of the write word line for decreased memory write latency, including but not limited to the SRAM bit cells in FIGS. 2A-6C, and according to any aspects disclosed herein. The CPU 1108 is coupled to a system bus 1114 and can intercouple master and slave devices included in the processor-based system 1100. As is well known, the CPU 1108 communicates with these other devices by exchanging address, control, and data information over the system bus 1114. For example, the CPU 1108 can communicate bus transaction requests to a memory controller 1116 as an example of a slave device. Although not illustrated in FIG. 11, multiple system buses 1114 could be provided, wherein each system bus 1114 constitutes a different fabric.

Other master and slave devices can be connected to the system bus 1114. As illustrated in FIG. 11, these devices can include a memory system 1120 that includes the memory controller 1116 and a memory array(s) 1118, one or more input devices 1122, one or more output devices 1124, one or more network interface devices 1126, and one or more display controllers 1128, as examples. The memory array 1118 can include SRAM bit cells 1102(2) according to a circuit cell design layout employing an increased width write word line based on a circuit cell layout area savings achieved by employing a reduced width read word line to reduce the resistance of the write word line for decreased memory write latency, including but not limited to the SRAM bit cells in FIGS. 2A-6C, and according to any aspects disclosed herein. The input device(s) 1122 can include any type of input device, including but not limited to input keys, switches, voice processors, etc. The input device(s) 1122 can include memory that includes SRAM bit cells 1102(3) according to a circuit cell design layout employing an increased width write word line based on a circuit cell layout area savings achieved by employing a reduced width read word line to reduce the resistance of the write word line for decreased memory write latency, including but not limited to the SRAM bit cells in FIGS. 2A-6C, and according to any aspects disclosed herein. The output device(s) 1124 can include any type of output device, including, but not limited to, audio, video, other visual indicators, etc. The output device(s) 1124 can include memory that includes SRAM bit cells 1102(4) according to a circuit cell design layout employing an increased width write word line based on a circuit cell layout area savings achieved by employing a reduced width read word line to reduce the resistance of the write word line for decreased memory write latency, including but not limited to the SRAM bit cells in FIGS. 2A-6C, and according to any aspects disclosed herein.

The network interface device(s) 1126 can be any device configured to allow exchange of data to and from a network 1130. The network 1130 can be any type of network, including but not limited to a wired or wireless network, a private or public network, a local area network (LAN), a wireless local area network (WLAN), a wide area network (WAN), a BLUETOOTH™ network, and the Internet. The network interface device(s) 1126 can be configured to support any type of communications protocol desired.

The CPU 1108 may also be configured to access the display controller(s) 1128 over the system bus 1114 to control information sent to one or more displays 1132. The display controller(s) 1128 sends information to the display(s) 1132 to be displayed via one or more video processors 1134, which process the information to be displayed into a format suitable for the display(s) 1132. The display(s) 1132 can include any type of display, including, but not limited to, a cathode ray tube (CRT), a liquid crystal display (LCD), a plasma display, a light emitting diode (LED) display, etc. The display controller(s) 1128, video processor(s) 1134, and/or the display(s) 1132 can include memory that includes SRAM bit cells 1102(4) according to a circuit cell design layout employing an increased width write word line based on a circuit cell layout area savings achieved by employing a reduced width read word line to reduce the resistance of the write word line for decreased memory write latency, including but not limited to the SRAM bit cells in FIGS. 2A-6C, and according to any aspects disclosed herein.

Figure 12:
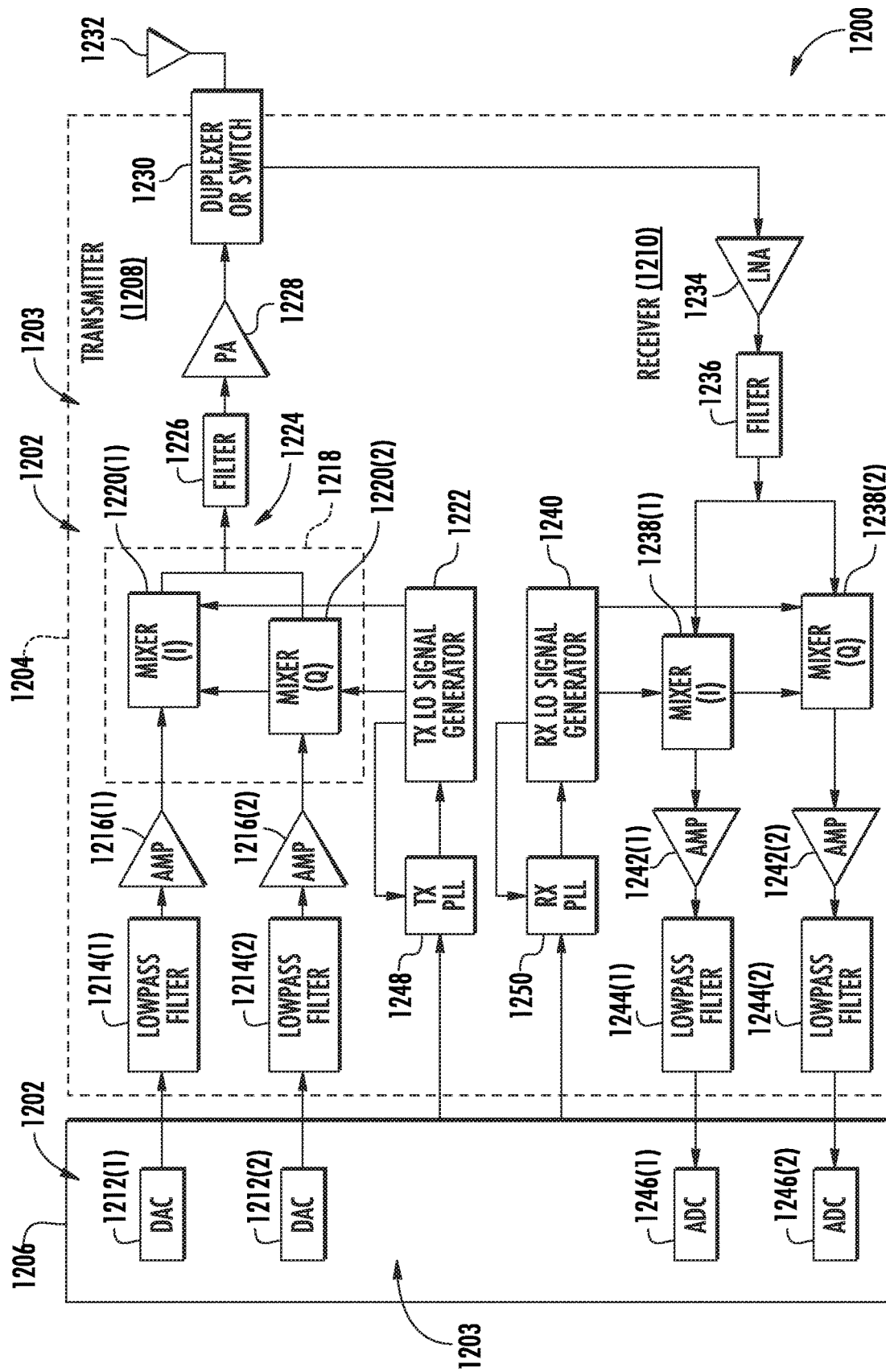
FIG. 12 is a block diagram of an exemplary wireless communications device that includes radio frequency (RF) components that can include a memory(ies) that includes SRAM bit cells according to a circuit cell design layout employing an increased width write word line based on a circuit cell layout area savings achieved by employing a reduced width read word line to reduce the resistance of the write word line for decreased memory write latency, including but not limited to the SRAM bit cells in FIGS. 2A-6C.

FIG. 12 illustrates an exemplary wireless communications device 1200 that includes radio frequency (RF) components that include memory that includes SRAM bit cells 1202 according to a circuit cell design layout employing an increased width write word line based on a circuit cell layout area savings achieved by employing a reduced width read word line to reduce the resistance of the write word line for decreased memory write latency, including but not limited to the SRAM bit cells in FIGS. 2A-6C, and according to any aspects disclosed herein. The wireless communications device 1200 may include or be provided in any of the above referenced devices, as examples. As shown in FIG. 12, the wireless communications device 1200 includes a transceiver 1204 and a data processor 1206. The data processor 1206 may include a memory to store data and program codes. The transceiver 1204 includes a transmitter 1208 and a receiver 1210 that support bi-directional communications. In general, the wireless communications device 1200 may include any number of transmitters 1208 and/or receivers 1210 for any number of communication systems and frequency bands. All or a portion of the transceiver 1204 may be implemented on one or more analog ICs, RF ICs (RFICs), mixed-signal ICs, etc.

The transmitter 1208 or the receiver 1210 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1210. In the direct-conversion architecture, a signal is frequency-converted between RF and baseband in one stage. The super-heterodyne and direct-conversion architectures may use different circuit blocks and/or have different requirements. In the wireless communications device 1200 in FIG. 12, the transmitter 1208 and the receiver 1210 are implemented with the direct-conversion architecture.

In the transmit path, the data processor 1206 processes data to be transmitted and provides I and Q analog output signals to the transmitter 1208. In the exemplary wireless communications device 1200, the data processor 1206 includes digital-to-analog converters (DACs) 1212(1), 1212(2) for converting digital signals generated by the data processor 1206 into I and Q analog output signals, e.g., I and Q output currents, for further processing.

Within the transmitter 1208, lowpass filters 1214(1), 1214(2) filter the I and Q analog output signals, respectively, to remove undesired signals caused by the prior digital-to-analog conversion. Amplifiers (AMPs) 1216(1), 1216(2) amplify the signals from the lowpass filters 1214(1), 1214(2), respectively, and provide I and Q baseband signals. An upconverter 1218 upconverts the I and Q baseband signals with I and Q transmit (TX) local oscillator (LO) signals through mixers 1220(1), 1220(2) from a TX LO signal generator 1222 to provide an upconverted signal 1224. A filter 1226 filters the upconverted signal 1224 to remove undesired signals caused by the frequency upconversion as well as noise in a receive frequency band. A power amplifier (PA) 1228 amplifies the upconverted signal 1224 from the filter 1226 to obtain the desired output power level and provides a transmit RF signal. The transmit RF signal is routed through a duplexer or switch 1230 and transmitted via an antenna 1232.

In the receive path, the antenna 1232 receives signals transmitted by base stations and provides a received RF signal, which is routed through the duplexer or switch 1230 and provided to a low noise amplifier (LNA) 1234. The duplexer or switch 1230 is designed to operate with a specific receive (RX)-to-TX duplexer frequency separation, such that RX signals are isolated from TX signals. The received RF signal is amplified by the LNA 1234 and filtered by a filter 1236 to obtain a desired RF input signal. Downconversion mixers 1238(1), 1238(2) mix the output of the filter 1236 with I and Q RX LO signals (i.e., LO_I and LO_Q) from an RX LO signal generator 1240 to generate I and Q baseband signals. The I and Q baseband signals are amplified by AMPs 1242(1), 1242(2) and further filtered by lowpass filters 1244(1), 1244(2) to obtain I and Q analog input signals, which are provided to the data processor 1206. In this example, the data processor 1206 includes analog-to-digital converters (ADCs) 1246(1), 1246(2) for converting the analog input signals into digital signals to be further processed by the data processor 1206.

In the wireless communications device 1200 of FIG. 12, the TX LO signal generator 1222 generates the I and Q TX LO signals used for frequency upconversion, while the RX LO signal generator 1240 generates the I and Q RX LO signals used for frequency downconversion. Each LO signal is a periodic signal with a particular fundamental frequency. A TX phase-locked loop (PLL) circuit 1248 receives timing information from the data processor 1206 and generates a control signal used to adjust the frequency and/or phase of the TX LO signals from the TX LO signal generator 1222. Similarly, an RX PLL circuit 1250 receives timing information from the data processor 1206 and generates a control signal used to adjust the frequency and/or phase of the RX LO signals from the RX LO signal generator 1240.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. An integrated circuit (IC), comprising:
   a semiconductor layer, comprising:
   a static random access memory (SRAM) bit cell circuit, comprising:
      a storage node;
      a write access circuit coupled to the storage node; and
      a first read access circuit coupled to the storage node;
   a first metal layer disposed above the semiconductor layer, the first metal layer comprising:
      a write word line (WWL) coupled to the write access circuit, the WWL having a longitudinal axis extending in a first direction and having a width in a second direction orthogonal to the first direction; and
      a first read word line (RWL) interconnect of a first RWL coupled to the first read access circuit, the first RWL interconnect having a longitudinal axis extending in the first direction and having a width in the second direction;
      the width of the WWL greater than the width of the first RWL interconnect;
   a second metal layer disposed above the first metal layer, the second metal layer comprising a second RWL interconnect of the first RWL having a longitudinal axis extending in the second direction; and
   a first RWL interconnect via coupled to the first RWL interconnect and the second RWL interconnect, the first RWL interconnect via having a length in the first direction;
   the length of the first RWL interconnect via greater than the width of the first RWL interconnect.

2. The IC of claim 1, wherein a ratio of the width of the WWL to the width of the first RWL interconnect is between 1.1-2.2.

3. The IC of claim 1, further comprising:
   a WWL via coupled to the WWL, the WWL via having a width in the second direction;
   the length of the first RWL interconnect via greater than the width of the WWL via.

4. The IC of claim 3, wherein the length of the first RWL interconnect via is at least fifty percent (50%) greater than the width of the WWL via.

5. The IC of claim 1, wherein:
   the SRAM bit cell circuit further comprises a second read access circuit coupled to the storage node; and
   the first metal layer further comprises:
      a first RWL interconnect of a second RWL coupled to the second read access circuit, the first RWL interconnect of the second RWL having a longitudinal axis extending in the first direction and having a width in the second direction;
   wherein:
      the first RWL interconnect of the second RWL is disconnected from the first RWL interconnect of the first RWL; and
      the width of the WWL is greater than the width of the first RWL interconnect of the second RWL.

6. The IC of claim 1, wherein a length of the second RWL interconnect in the first direction is greater than the length of the first RWL interconnect via.

7. The IC of claim 1, wherein:
   the semiconductor layer further comprises:
      a second SRAM bit cell circuit, comprising:
         a second storage node;
         a second write access circuit coupled to the second storage node; and
         a second read access circuit coupled to the second storage node;
   the first metal layer further comprises:
      a second WWL coupled to the second write access circuit, the second WWL having a longitudinal axis extending in the first direction and having a width in the second direction; and
      a first RWL interconnect of a second RWL coupled to the second read access circuit and having a longitudinal axis extending in the first direction and having a width in the second direction;
      the width of the second WWL is greater than the width of the first RWL interconnect of the second RWL; and
   further comprising:
      a third metal layer disposed above the second metal layer, the third metal layer comprising:
         the first RWL extending in a longitudinal axis in the first direction and coupled to the first RWL interconnect of the first RWL; and
         the second RWL extending in a longitudinal axis parallel to the longitudinal axis of the first RWL and coupled to the first RWL interconnect of the second RWL.

8. The IC of claim 7, wherein:
   the second metal layer further comprises a second RWL interconnect of the second RWL having a longitudinal axis extending in the second direction; and
   further comprising a second RWL interconnect via coupled to the first RWL interconnect of the second RWL and the second RWL interconnect of the second RWL, the second RWL interconnect via having a length in the first direction; and
   wherein:
      the first RWL is coupled to the first RWL interconnect of the first RWL by being coupled to the second RWL interconnect of the first RWL; and
      the second RWL is coupled to the first RWL interconnect of the second RWL by being coupled to the second RWL interconnect of the second RWL.

9. The IC of claim 1, further comprising:
   a WWL via disposed between the semiconductor layer and the first metal layer, the WWL via coupled to the write access circuit and the WWL; and
   a RWL via disposed between the semiconductor layer and the first metal layer, the RWL via coupled to the first read access circuit and the first RWL interconnect of the first RWL.

10. An integrated circuit (IC), comprising:
a semiconductor layer, comprising:
   a static random access memory (SRAM) bit cell circuit, comprising:
      a storage node;
      a write access circuit coupled to the storage node; and
      a read access circuit coupled to the storage node; and
a first metal layer disposed above the semiconductor layer, the first metal layer comprising:
   a write word line (WWL) coupled to the write access circuit, the WWL having a longitudinal axis extending in a first direction and having a width in a second direction orthogonal to the first direction; and
   a first read word line (RWL) interconnect of a first RWL coupled to the read access circuit, the first RWL interconnect having a longitudinal axis extending in the first direction and having a width in the second direction;
   wherein a ratio of the width of the WWL to the width of the first RWL interconnect is between 1.1-2.2.

11. The IC of claim 10, wherein:
the SRAM bit cell circuit further comprises a second read access circuit coupled to the storage node; and
the first metal layer further comprises:
   a first RWL interconnect of a second RWL coupled to the second read access circuit, the first RWL interconnect of the second RWL having a longitudinal axis extending in the first direction and having a width in the second direction;
   wherein:
      the first RWL interconnect of the second RWL is disconnected from the first RWL interconnect of the first RWL; and
      the width of the WWL is greater than the width of the first RWL interconnect of the second RWL.

12. The IC of claim 10, further comprising:
a second metal layer disposed above the first metal layer, the second metal layer comprising a second RWL interconnect of the first RWL having a longitudinal axis extending in the second direction; and
a first RWL interconnect via coupled to the first RWL interconnect and the second RWL interconnect, the first RWL interconnect via having a length in the first direction;
wherein:
   a length of the second RWL interconnect in the first direction is greater than the length of the first RWL interconnect via.

13. The IC of claim 10, wherein:
the semiconductor layer further comprises:
   a second SRAM bit cell circuit, comprising:
      a second storage node;
      a second write access circuit coupled to the second storage node; and
      a second read access circuit coupled to the second storage node; and
the first metal layer further comprises:
   a second WWL coupled to the second write access circuit, the second WWL having a longitudinal axis extending in the first direction and having a width in the second direction; and
   a first RWL interconnect of a second RWL coupled to the second read access circuit and having a longitudinal axis extending in the first direction and having a width in the second direction;
the width of the second WWL is greater than the width of the first RWL interconnect of the second RWL.

14. The IC of claim 13, further comprising:
a second metal layer disposed above the first metal layer, the second metal layer comprising a second RWL interconnect of the second RWL having a longitudinal axis extending in the second direction; and
a second RWL interconnect via coupled to the first RWL interconnect of the second RWL and the second RWL interconnect of the second RWL, the second RWL interconnect via having a length in the first direction;
wherein:
   a length of the second RWL interconnect in the first direction is greater than the length of the second RWL interconnect via.

15. An integrated circuit (IC), comprising:
a semiconductor layer, comprising:
   a static random access memory (SRAM) bit cell circuit, comprising:
      a storage node;
      a write access circuit coupled to the storage node; and
      a read access circuit coupled to the storage node;
a first metal layer disposed above the semiconductor layer, the first metal layer comprising:
   a write word line (WWL) coupled to the write access circuit, the WWL having a longitudinal axis extending in a first direction and having a width in a second direction orthogonal to the first direction; and
   a first read word line (RWL) interconnect of a first RWL coupled to the read access circuit, the first RWL interconnect having a longitudinal axis extending in the first direction and having a width in the second direction;
   the width of the WWL greater than the width of the first RWL interconnect;
a WWL via coupled to the WWL, the WWL via having a length in the first direction;
a second metal layer disposed above the first metal layer, the second metal layer comprising a second RWL interconnect of the first RWL having a longitudinal axis extending in the second direction; and
a first RWL interconnect via coupled to the first RWL interconnect and the second RWL interconnect, the first RWL interconnect via having a length in the first direction;
the length of the first RWL interconnect via greater than the length of the WWL via.

16. The IC of claim 15, wherein the length of the first RWL interconnect via is at least fifty percent (50%) greater than the length of the WWL via.

17. The IC of claim 15, wherein:
the SRAM bit cell circuit further comprises a second read access circuit coupled to the storage node; and
the first metal layer further comprises:
   a first RWL interconnect of a second RWL coupled to the second read access circuit, the first RWL interconnect of the second RWL having a longitudinal axis extending in the first direction and having a width in the second direction;
   wherein:
      the first RWL interconnect of the second RWL is disconnected from the first RWL interconnect of the first RWL; and
      the width of the WWL is greater than the width of the first RWL interconnect of the second RWL.

18. The IC of claim 15, wherein a length of the second RWL interconnect in the first direction is greater than the length of the first RWL interconnect via.

19. The IC of claim 15, wherein:
the semiconductor layer further comprises:
   a second SRAM bit cell circuit, comprising:
      a second storage node;
      a second write access circuit coupled to the second storage node; and
      a second read access circuit coupled to the second storage node;
the first metal layer further comprises:
   a second WWL coupled to the second write access circuit, the second WWL having a longitudinal axis extending in the first direction and having a width in the second direction; and
   a first RWL interconnect of a second RWL coupled to the second read access circuit and having a longitudinal axis extending in the first direction and having a width in the second direction;
the width of the second WWL greater than the width of the first RWL interconnect of the second RWL; and
further comprising:
   a third metal layer disposed above the second metal layer, the third metal layer comprising:
      the first RWL extending in a longitudinal axis in the first direction and coupled to the first RWL interconnect of the first RWL; and
      the second RWL extending in a longitudinal axis parallel to the longitudinal axis of the first RWL and coupled to the first RWL interconnect of the second RWL.

20. The IC of claim 19, wherein:
the second metal layer further comprises a second RWL interconnect of the second RWL having a longitudinal axis extending in the second direction; and
further comprising a second RWL interconnect via coupled to the first RWL interconnect of the second RWL and the second RWL interconnect of the second RWL, the second RWL interconnect via having a length in the first direction; and
wherein:
   the first RWL is coupled to the first RWL interconnect of the first RWL by being coupled to the second RWL interconnect of the first RWL; and
   the second RWL is coupled to the first RWL interconnect of the second RWL by being coupled to the second RWL interconnect of the second RWL.

\* \* \* \* \*